(12) United States Patent
Noh et al.

(10) Patent No.: US 12,132,114 B2
(45) Date of Patent: Oct. 29, 2024

(54) DISPLAY DEVICE AND METHOD FOR MANUFACTURING THE SAME

(71) Applicant: LG Display Co., Ltd., Seoul (KR)

(72) Inventors: SoYoung Noh, Goyang-Si (KR); YoungJang Lee, Seoul (KR); HyoJin Kim, Seoul (KR); Hyuk Ji, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/689,890

(22) Filed: Mar. 8, 2022

(65) Prior Publication Data

US 2022/0199835 A1 Jun. 23, 2022

Related U.S. Application Data

(62) Division of application No. 16/663,275, filed on Oct. 24, 2019, now Pat. No. 11,302,821, which is a
(Continued)

(30) Foreign Application Priority Data

Jun. 30, 2017 (KR) ........................ 10-2017-0083675

(51) Int. Cl.
*H01L 29/786* (2006.01)
*H01L 27/12* (2006.01)
(Continued)

(52) U.S. Cl.
CPC .... *H01L 29/78618* (2013.01); *H01L 27/1225* (2013.01); *H01L 27/1248* (2013.01);
(Continued)

(58) Field of Classification Search
CPC ........... H01L 29/78618; H01L 27/1225; H01L 27/1248; H01L 27/1251; H01L 27/1255;
(Continued)

(56) References Cited

U.S. PATENT DOCUMENTS 8,203,264 B2 6/2012 Kang et al.
8,890,406 B2 11/2014 Kang et al.
(Continued)

FOREIGN PATENT DOCUMENTS

CN 105390503 A 3/2016
JP 2007-164183 A 6/2007
(Continued)

OTHER PUBLICATIONS

Korean Intellectual Property Office, Office Action, KR Patent Application No. 10-2017-0083675, Jul. 7, 2022, nine pages.
(Continued)

*Primary Examiner* — Samuel Park
(74) *Attorney, Agent, or Firm* — Fenwick & West LLP

(57) ABSTRACT

Provided are a display device and a method for manufacturing the same. The display device includes: a connection source electrode and a connection drain electrode connected to a first source electrode a the first drain electrode, respectively by penetrating an isolation insulating layer and a second interlayer dielectric layer to enhance a characteristic of an element and reliability of the display device.

12 Claims, 20 Drawing Sheets

Related U.S. Application Data division of application No. 15/794,986, filed on Oct. 26, 2017, now Pat. No. 10,490,668.

(51) Int. Cl.
*H01L 29/417* (2006.01)
*H10K 59/121* (2023.01)

(52) U.S. Cl.
CPC ...... *H01L 27/1251* (2013.01); *H01L 27/1255* (2013.01); *H01L 27/1262* (2013.01); *H01L 27/127* (2013.01); *H01L 29/41733* (2013.01); *H01L 29/78675* (2013.01); *H01L 29/7869* (2013.01); *H10K 59/1213* (2023.02)

(58) Field of Classification Search
CPC ............... H01L 27/1262; H01L 27/127; H01L 29/41733; H01L 29/78675; H01L 29/7869; H01L 27/3262; H01L 27/1222; H01L 27/3244; H01L 2227/323; H01L 27/323; H01L 27/3258; H01L 27/3265; H01L 51/56; H10K 59/1213; H10K 59/12; H10K 59/1201; H10K 59/1216; H10K 59/124; H10K 59/40; H10K 71/00
See application file for complete search history.

(56) References Cited

U.S. PATENT DOCUMENTS

| | | | |
|---|---|---|---|
| 9,691,833 B2 | 6/2017 | Oh et al. | |
| 10,121,899 B2 | 11/2018 | Moon et al. | |
| 2007/0120126 A1* | 5/2007 | Sung | H01L 51/5206 257/40 |
| 2007/0132365 A1 | 6/2007 | Kang et al. | |
| 2009/0050894 A1* | 2/2009 | Park | H01L 29/66757 257/E21.414 |
| 2012/0211777 A1 | 8/2012 | Kang et al. | |
| 2012/0241733 A1 | 9/2012 | Morooka et al. | |
| 2015/0001534 A1 | 1/2015 | Chang et al. | |
| 2016/0064421 A1 | 3/2016 | Oh et al. | |
| 2016/0064465 A1 | 3/2016 | Oh et al. | |
| 2016/0071891 A1 | 3/2016 | Oh et al. | |
| 2016/0093647 A1 | 3/2016 | Kim et al. | |
| 2016/0293771 A1 | 10/2016 | Long et al. | |
| 2017/0075450 A1* | 3/2017 | Wang | G06F 3/04184 |
| 2017/0155000 A1 | 6/2017 | Moon et al. | |
| 2017/0278916 A1* | 9/2017 | Maruyama | H01L 27/1225 |
| 2018/0012948 A1 | 1/2018 | Lee | |
| 2018/0012950 A1 | 1/2018 | Jung | |
| 2018/0061870 A1 | 3/2018 | Yang | |
| 2018/0076239 A1 | 3/2018 | Suzumura et al. | |
| 2018/0083076 A1 | 3/2018 | Hanada | |
| 2018/0089486 A1* | 3/2018 | Kim | G06V 40/1359 |
| 2018/0122835 A1 | 5/2018 | Watakabe et al. | |
| 2018/0130857 A1* | 5/2018 | Lee | H10K 59/131 |
| 2018/0308916 A1 | 10/2018 | Kim et al. | |
| 2018/0366586 A1* | 12/2018 | Son | H01L 51/0097 |

FOREIGN PATENT DOCUMENTS

| | | |
|---|---|---|
| JP | 2012-204077 A | 10/2012 |
| KR | 10-0759692 B1 | 9/2007 |
| KR | 10-2013-0016546 A | 2/2013 |
| KR | 10-2014-0079093 A | 6/2014 |
| KR | 10-2015-0076485 A | 7/2015 |
| KR | 10-2015-0100568 A | 9/2015 |
| KR | 10-2015-0101411 A | 9/2015 |
| KR | 10-2015-0101413 A | 9/2015 |
| KR | 10-2015-0101418 A | 9/2015 |
| KR | 10-2017-0061776 A | 6/2017 |
| KR | 10-2018-0137640 A | 12/2018 |

OTHER PUBLICATIONS

Korean Intellectual Property Administration, Office Action, KR Patent Application No. 10-2017-0083675, Jan. 25, 2022, 22 pages.
United States Office Action, U.S. Appl. No. 15/794,986, Jun. 19, 2019, six pages.
United States Office Action, U.S. Appl. No. 15/794,986, Apr. 25, 2019, 12 pages.
United States Office Action, U.S. Appl. No. 15/794,986, Feb. 4, 2019, 15 pages.
United States Office Action, U.S. Appl. No. 15/794,986, Sep. 27, 2018, 12 pages.
United States Office Action, U.S. Appl. No. 16/663,275, Aug. 18, 2021, 19 pages.
United States Office Action, U.S. Appl. No. 16/663,275, Feb. 19, 2021, nine pages.
Korean Intellectual Property Office, Office Action, KR Patent Application No. 10-2023-0043573, Apr. 28, 2023, 21 pages.
Korean Intellectual Property Office, Office Action, Korean Patent Application No. 10-2023-0043573, Feb. 20, 2024, 23 pages.

* cited by examiner

DISPLAY DEVICE AND METHOD FOR MANUFACTURING THE SAME

CROSS-REFERENCE TO RELATED APPLICATIONS

This patent application is a divisional application of U.S. patent application Ser. No. 16/663,275 filed on Oct. 24, 2019, which is a divisional application of U.S. patent application Ser. No. 15/794,986 filed on Oct. 26, 2017, now U.S. Pat. No. 10,490,668 issued on Nov. 26, 2019, which claims priority to Republic of Korea Patent Application No. 10-2017-0083675 filed on Jun. 30, 2017, all of which are hereby incorporated by reference in their entirety.

BACKGROUND

Field of Technology

The present disclosure relates to a display device and a method for manufacturing the same, and more particularly, to a display device in which a plurality of thin film transistors is formed by separating upper and lower layers.

Discussion of the Related Art

In recent years, a display field for visually expressing electrical information signals has rapidly developed as the information age has come to a full-scale information age and in response to this, various flat display devices having excellent performance such as a decrease in thickness, weight, and power consumption have been developed and replaced the existing cathode ray tube (CRT).

Specific examples of such flat panel display devices may include a liquid crystal display (LCD), an organic light emitting display (OLED), an electrophoretic display (EPD), a plasma display (PDP), and an electro wetting display.

The display device includes a display region for displaying an image. A plurality of thin film transistor is positioned in a pixel circuit and a driving circuit of the display region to drive elements of a plurality of pixels. A process of forming a plurality of thin film transistors includes a process of forming a hole penetrating a plurality of layers and a semiconductor element may be damaged while forming the hole. In particular, while semiconductor elements are exposed through holes having different depths, a semiconductor element exposed through a relatively shallow hole may be damaged. Damage to the surface of the semiconductor element exposed through the hole during the process reduces drivability of the element and decreases reliability of the display device.

SUMMARY

The inventors of the present disclosure recognized that a plurality of thin film transistors is formed by different semiconductors to improve an operating characteristic of a pixel in a method for manufacturing a display device.

Furthermore, the inventors have invented a method for manufacturing a display device, which can minimize a manufacturing process and reduce damage to semiconductor elements while forming the respective semiconductors of the plurality of thin film transistors in different layers in order to form the plurality of thin film transistors by different semiconductors.

Therefore, an object to be achieved by the present disclosure is to provide a display device and a method for manufacturing the same which reduce damages to semiconductor layers when forming contact holes respectively exposing the semiconductor layers of a plurality of thin fil m transistors disposed in different layers. Another object to be achieved by the present disclosure is to provide a display device and a method for manufacturing the same which reduce the number of masks required for a manufacturing process of the display device and reduce damages to semiconductor elements by forming a source electrode and a drain electrode of a thin film transistor based on a semiconductor material.

The objects of the present disclosure are not limited to the aforementioned objects, and other objects, which are not mentioned above, will be apparent to a person having ordinary skill in the art from the following description.

According to an aspect of the present disclosure, there is provided a display device. The display device includes: a first thin film transistor including a first active layer, a first insulating layer on the first active layer, and a first source electrode and a first drain electrode connected to the first active layer through a first contact hole formed in the first insulating layer; a second thin film transistor including a second active layer on the first insulating layer, a second insulating layer on the second active layer, and a second source electrode and a second drain electrode connected to the second active layer through a second contact hole formed in the second insulating layer; and a connection source electrode and a connection drain electrode connected to the first source electrode and the first drain electrode, respectively through a third contact hole formed in the second insulating layer. Therefore, a characteristic of a thin film transistor and reliability of the display device may be enhanced.

According to another aspect of the present disclosure, there is provided a display device. The display device includes: a first thin film transistor including a first active layer, a first insulating layer on the first active layer, and a first source electrode and a first drain electrode connected to the first active layer through a first contact hole of the first insulating layer; and a second thin film transistor including a second active layer on the first insulating layer, a second insulating layer on the second active layer, and a second source electrode and a second drain electrode connected to the second active layer through a second contact hole of the second insulating layer. The first source electrode and the first drain electrode are made of a conductivized semiconductor material. Therefore, the number of masks used in a method for manufacturing the display device may be reduced.

According to yet another aspect of the present disclosure, there is provided a method for manufacturing a display device. The method includes: forming a first active layer, a first insulating layer on the first active layer, and a first source electrode and a first drain electrode connected to the first active layer by penetrating the first insulating layer; forming a second active layer on the first insulating layer, and a second insulating layer on the second active layer; and forming a connection source electrode and a connection drain electrode connected to the first source electrode and the first drain electrode, respectively by penetrating the second insulating layer and forming a second source electrode and a second drain electrode connected to the second active layer by penetrating the second insulating layer. As a result, performance of a thin film transistor is enhanced by reducing damage to an active layer of the thin film transistor.

According to still yet another aspect of the present disclosure, there is provided a method for manufacturing a display device. The method includes: forming a first active layer, and a first insulating layer on the first active layer; forming a first semiconductor material connected to the first active layer by penetrating the first insulating layer and a second semiconductor material spaced apart from the first semiconductor material, on the first insulating layer; forming a first source electrode and a first drain electrode with the first semiconductor material and forming a second active layer having conductivized source and drain regions at both sides of the second semiconductor material by conductivizing both sides of the second semiconductor material and the first semiconductor material; forming a second insulating layer covering the first source electrode, the first drain electrode, and the second active layer; and forming a second source electrode and a second drain electrode connected to the second active layer by penetrating the second insulating layer. Therefore, as the number of masks required during a process of manufacturing the display device is reduced, process cost may be reduced.

Details of other exemplary embodiments will be included in the detailed description of the present disclosure and the accompanying drawings.

According to the present disclosure, characteristics of a thin film transistor and reliability of a display device can be enhanced by reducing damages to active layers of thin film transistors disposed in different layers.

Further, according to the present disclosure, as the number of masks used in a method for manufacturing the display device decreases, process cost can be greatly reduced.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
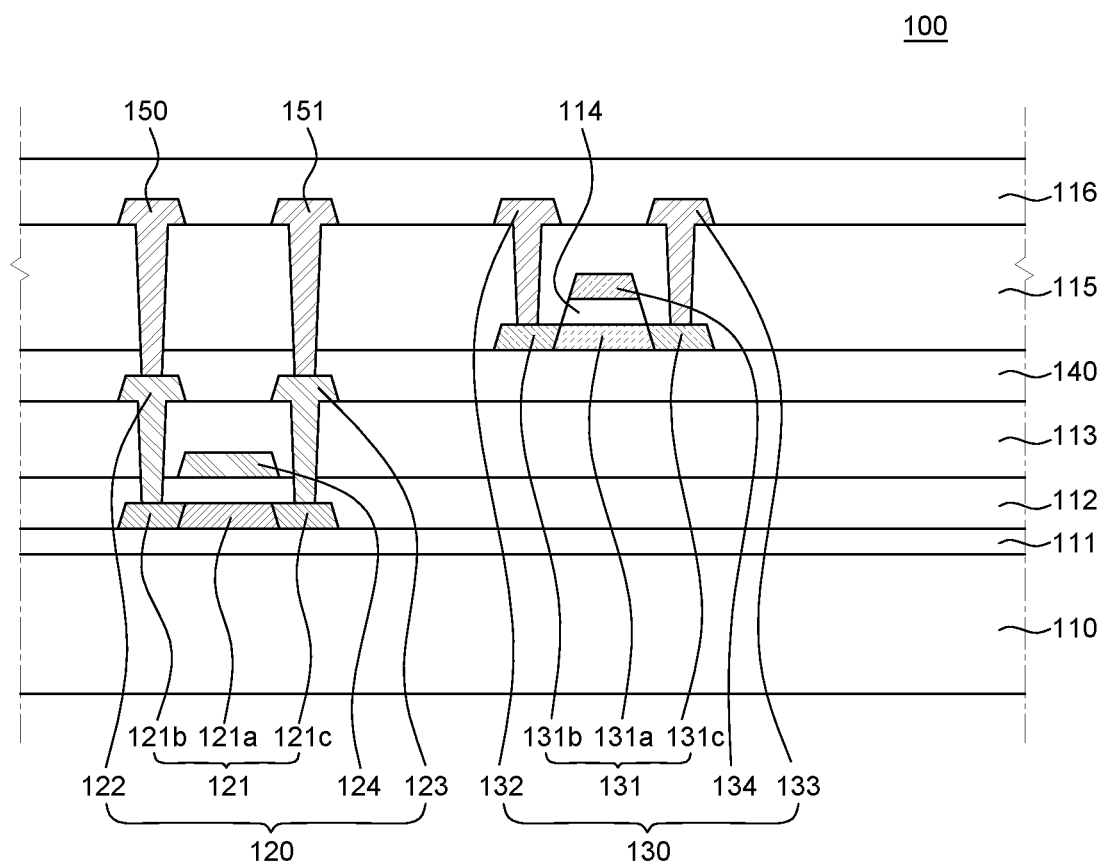
FIG. 1 is a cross-sectional view for describing a display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various exemplary embodiments of the present disclosure will be described in detail with reference to the accompanying drawings.

A display device of the present disclosure may be applied to an organic light emitting display (OLED), but is not limited thereto and may be applied to various flat panel display. For example, the display device may be applied even to a liquid crystal display (LCD) and a quantum dot light emitting display (QLED).

FIG. 1 is a cross-sectional view for describing the display device according to the exemplary embodiment of the present disclosure. Referring to FIG. 1, the display device 100 according to the exemplary embodiment of the present disclosure includes a substrate 110, a buffer layer 111, a first thin film transistor 120, a second thin film transistor 130, an isolation insulating layer 140, a first gate insulating layer 112, a first interlayer dielectric layer 113, a second gate insulating layer 114, a second interlayer dielectric layer 115, a passivation layer 116, a connection source electrode 150, and a connection drain electrode 151.

In detail, the substrate 110 supports various components of the display device 100 according to the exemplary embodiment of the present disclosure. The substrate 110 may be made of glass or a plastic material having flexibility. When the substrate 110 is made of the plastic material, the substrate 110 may be made of, for example, polyimide (PI). When the substrate 110 is made of polyimide (PI), a display device manufacturing process is performed in a state that a support substrate made of glass is disposed below the substrate 110 and after the display device manufacturing process is completed, the support substrate may be released. In addition, a back plate for supporting the substrate 110 may be disposed below the substrate 110 after the support substrate is released.

The buffer layer 111 may be formed on a whole surface of the substrate. The buffer layer 111 may be a single layer of silicon nitride (SiNx) or silicon oxide (SiOx), or multiple layers of silicon nitride (SiNx) and silicon oxide (SiOx). The buffer layer 111 may serve to enhance adhesion force between layers formed on the buffer layer 111 and the substrate 110 and block alkali component, and the like which flow out from the substrate 110. However, the buffer layer 111 is not an essential component and may be omitted based on a kind and a material of the substrate 110, a structure and a type of the thin film transistor, and the like.

The first thin film transistor 120 may be disposed on the buffer layer 111. The first thin film transistor 120 may include a first active layer 121, a first gate electrode 124, a first source electrode 122, and a first drain electrode 123. A first active layer 121 of the first thin film transistor 120 may be disposed on the buffer layer 111.

The first active layer 121 may include low temperature poly silicon (LTPS). Since a polysilicon material is high in mobility (100 cm$^2$/Vs or higher), low in energy consumption power, and excellent in reliability, the polysilicon material may be applied to a gate driver for a driving device and/or a multiplexer (MUX) for driving the thin film transistors for a display element. In the display device according to the exemplary embodiment, the polysilicon material may be applied to the active layer of a driving thin film transistor. Polysilicon may be formed by depositing an amorphous silicon (a-Si) material on the buffer layer 111 and performing a dehydrogenation process and a crystallization process. The first active layer 121 may be formed by patterning the polysilicon. The first active layer 121 may include a first channel region 121a in which a channel is formed when the first thin film transistor 120 is driven, and a first source region 121b and a first drain region 121c on both sides of the first channel region 121a. The first source region 121b means a portion of the first active layer 121 connected to the first source electrode 122 and the first drain region 121c means a portion of the first active layer 121 connected to the first drain electrode 123. The first channel region 121a, the first source region 121b, and the first drain region 121c may be configured by ion doping (impurity doping) of the first active layer 121. The first source region 121b and the first drain region 121c may be generated by ion-doping the polysilicon material and in this case, the first channel region 121a may mean a portion which is not ion-doped but left as the polysilicon material.

The first gate insulating layer 112 may be disposed on the first active layer 121 of the first thin film transistor 120. The first gate insulating layer 112 may be configured by a single layer of silicon nitride (SiNx) and silicon oxide (SiOx) or multiple layers of silicon nitride (SiNx) or silicon oxide (SiOx). Contact holes may be formed in the first gate insulating layer 112 in order to connect the first source electrode 122 and the first drain electrode 123 of the first thin film transistor 120 to the first source region 121b and the first drain region 121c of the first active layer 121 of the first thin film transistor 120, respectively.

The first gate electrode 124 of the first thin film transistor 120 is disposed on the first gate insulating layer 112. A metallic layer such as molybdenum (Mo) or the like may be formed on the first gate insulating layer 112 and the first gate electrode 124 may be formed by patterning the metallic layer. The first gate electrode 124 may be formed on the first gate insulating layer 112 so as to overlap with the first channel region 121a of the first active layer 121 of the first thin film transistor 120.

The first interlayer dielectric layer 113 may be disposed on the first gate insulating layer 112 and the first gate electrode 124. The first interlayer dielectric layer 113 may be made of, for example, silicon nitride (SiNx). The first interlayer dielectric layer 113 may be made of silicon nitride (SiNx) in order to supply hydrogen to the first active layer 121 of the first thin film transistor 120 during a hydrogenation process for the first active layer 121. The contact holes may be formed in the first interlayer dielectric layer 113, which are used for exposing the first source region 121b and the first drain region 121c of the first active layer 121 of the first thin film transistor 120.

The first source electrode 122 and the first drain electrode 123 may be connected to the first active layer 121 through the contact holes formed in the first interlayer dielectric layer 113 and the first gate insulating layer 112. For example, the first source electrode 122 and the first drain electrode 123 may be electrically connected to the first source region 121b and the first drain region 121c of the first active layer 121, respectively through the contact holes formed in the first interlayer dielectric layer 113 and the first gate insulating layer 112. The first source electrode 122 and the first drain electrode 123 may be conductive metal materials and may have a three-layer structure of, for example, titanium (Ti), aluminum (Al), and titanium (Ti). The first source electrode 122 and the first drain electrode 123 of the first thin film transistor 120 may be simultaneously formed by the same process. For example, a source/drain material layer may be formed on the first interlayer dielectric layer 113 and the source/drain material layer may be patterned so that the first source electrode 122 and the first drain electrode 123 are simultaneously formed. Therefore, the first source electrode 122 and the first drain electrode 123 of the first thin film transistor 120 may be made with the same thickness and the same material.

Meanwhile, the portions of the first active layer 121 connected to the first source electrode 122 and the first drain electrode 123, respectively may be conductivized. Specifically, after the contact holes are formed through the first gate insulating layer 112 and the first interlayer dielectric layer 113 to expose the first active layer 121, a part of the exposed first active layer 121 may be conductivized. At this time, the part of the first active layer 121 exposed through the contact hole may be conductivized through a heat treatment process. The first active layer 121 is heat-treated through the contact hole through which the first active layer 121 is exposed to effectively conductivizng a portion of the first active layer 121.

The isolation insulating layer 140 may be disposed on the first interlayer dielectric layer 113, the first source electrode 122, and the first drain electrode 123. The contact holes for exposing at least portions of the first source electrode 122 and the first drain electrode 123 may be formed in the isolation insulating layer 140. The isolation insulating layer 140 may serve to separate the second thin film transistor 130 disposed on the isolation insulating layer 140 and the first thin film transistor 120 disposed below the isolation insulating layer 140. For example, the isolation insulating layer 140 may be disposed on the first source electrode 122 and the first drain electrode 123 of the first thin film transistor 120 and the second thin film transistor 130 may be disposed on the isolation insulating layer 140.

A second active layer 131 of the second thin film transistor 130 may be disposed on the isolation insulating layer 140. The second thin transistor 130 may include the second active layer 131, a second gate electrode 134, a second source electrode 132, and a second drain electrode 133.

The second active layer 131 may be made of an oxide semiconductor. Since an oxide semiconductor material has a larger band gap than the silicon material, electrons hardly cross the band gap in an off state, and as a result, off-current is low. Therefore, the thin film transistor including the active layer made of the oxide semiconductor is suitable for a switching thin film transistor having a short on time and a long off time. In addition, since the off-current is low, the size of an auxiliary capacitor may be reduced, and as a result, the thin film transistor is suitable for a high-resolution display element. Specifically, the second active layer 131 is made of a metal oxide and may be made of various metal oxides such as indium-gallium-zinc-oxide (IGZO), indium-gallium-oxide (IGO), or indium-zinc-oxide (IZO) etc. The second active layer 131 may be formed by depositing the metal oxide on the isolation insulating layer 140, performing the heat treatment process for stabilization, and thereafter, patterning the metal oxide. The second active layer 131 may include a second channel region 131a in which the channel is formed when the second thin film transistor 130 is driven, and a second source region 131b and a second drain region 131c on both sides of the second channel region 131a. The second source region 131b means a portion of the second active layer 131 connected to the second source electrode 132 and the second drain region 131c means a portion of the second active layer 131 connected to the second drain electrode 133. The second channel region 131a, the second source region 131b, and the second drain region 131c may be defined by the ion doping (impurity doping) of the second active layer 131. The second source region 131b and the second drain region 131c may be formed by ion-doping the oxide semiconductor material.

The second gate insulating layer 114 may be disposed on the second active layer 131. The second gate insulating layer 114 may be configured by a single layer of silicon nitride (SiNx) or silicon oxide (SiOx) or multiple layers of silicon nitride (SiNx) and silicon oxide (SiOx). The second gate insulating layer 114 may be patterned to overlap with the second channel region 131a of the second active layer 131.

The second gate electrode 134 may be disposed on the second gate insulating layer 114. The second gate electrode 134 may be formed by forming the metallic layer such as molybdenum, etc., on the second gate insulating layer 114 and patterning the formed metallic layer. The second gate electrode 134 may be patterned to overlap with the second channel region 131a of the second active layer 131 and the second gate insulating layer 114.

The second interlayer dielectric layer 115 may be disposed on the isolation insulating layer 140, the second active layer 131, and the second gate electrode 134. The contact holes may be formed in the second interlayer dielectric layer 115, which are used for exposing the first source electrode 122, the first drain electrode 123, and the second source region 131b and the second drain region 131c of the second active layer 131.

The connection source electrode 150 and the connection drain electrode 151 may be electrically connected to the first source electrode 122 and the first drain electrode 123, respectively through the contact holes formed in the isolation insulating layer 140 and the second interlayer dielectric layer 115. Further, the second source electrode 132 and the second drain electrode 133 of the second thin film transistor 130 may be connected to the second active layer 131 through the contact hole formed in the second interlayer dielectric layer 115. The connection source electrode 150, the connection drain electrode 151, the second source electrode 132, and the second drain electrode 133 may be simultaneously formed in the same process. For example, the source/drain material layer may be formed on the second interlayer dielectric layer 115 and the source/drain material layer may be patterned so that the connection source electrode 150, the connection drain electrode 151, the second source electrode 132, and the second drain electrode 133 are simultaneously formed. Therefore, the connection source electrode 150, the connection drain electrode 151, the second source electrode 132, and the second drain electrode 133 may be made with the same material.

The first thin film transistor 120 may be disposed below the isolation insulating layer 140 and the second thin film transistor 130 may be disposed on the isolation insulating layer 140. Therefore, the first thin film transistor 120 and the second thin film transistor 130 may be isolated and disposed by the isolation insulating layer 140. The connection source electrode 150 and the connection drain electrode 151 are electrically connected to the first source electrode 122 and the first drain electrode 123 of the first thin film transistor 120, respectively to electrically connect the first source electrode 122 and the first drain electrode 123 up to an upper surface of the second interlayer dielectric layer 115.

The first source electrode 122 and the first drain electrode 123 and the connection source electrode 150 and the connection drain electrode 151 of the display device 100 according to the exemplary embodiment of the present disclosure are separately formed. For example, after the first thin film transistor 120 is formed, the isolation insulating layer 140 is formed on the first thin film transistor 120 and the second thin film transistor 130 is formed on the isolation insulating layer 140. As a result, the damage to the portions of the second active layer 131 connected to the second source electrode 132 and the second drain electrode 133 may be reduced.

Specifically, the first source electrode 122 and the connection source electrode 150, and the first drain electrode 123 and the connection drain electrode 151 may be configured to be connected to the first active layer 121 by being formed as one source electrode and one drain electrode through the contact hole that penetrates all of the first gate insulating layer 112, the first interlayer dielectric layer 113, the isolation insulating layer 140, and the second interlayer dielectric layer 115. In this case, the contact hole exposing the first active layer 121 by penetrating all of the first gate insulating layer 112, the first interlayer dielectric layer 113, the isolation insulating layer 140, and the second interlayer dielectric layer 115, and the contact hole that exposing the second active layer 131 by penetrating the second interlayer dielectric layer 115 may be simultaneously formed.

The first source electrode 122, the first drain electrode 123, the second source electrode 132, and the second drain electrode 133 may be simultaneously formed through the formed contact holes. For example, the source electrodes and the drain electrodes of the first thin film transistor 120 and the second thin film transistor 130 may be simultaneously generated. In this case, the contact hole exposing the first active layer 121 by penetrating all of the first gate insulating layer 112, the first interlayer dielectric layer 113, the isolation insulating layer 140, and the second interlayer dielectric layer 115, and the contact hole exposing the second active layer 131 by penetrating the second interlayer dielectric layer 115 may be formed through dry-etching. In order to form the contact hole exposing the first active layer 121 by penetrating all of the first gate insulating layer 112, the first interlayer dielectric layer 113, the isolation insulating layer 140, and the second interlayer dielectric layer 115, all of the first gate insulating layer 112, the first interlayer dielectric layer 113, the isolation insulating layer 140, and the second interlayer dielectric layer 115 need to be etched. Further, only the second interlayer dielectric layer 115 needs to be etched in order to form the contact hole exposing the second active layer 131 by penetrating the second interlayer dielectric layer 115. Therefore, a plurality of layers needs to be etched in order to form the contact hole exposing the first active layer 121 by penetrating all of the first gate insulating layer 112, the first interlayer dielectric layer 113, the isolation insulating layer 140, and the second interlayer dielectric layer 115 and the contact hole exposing the second active layer 131 by penetrating the second interlayer dielectric layer 115 together. The plurality of layers needs to be etched through the dry etching because it is difficult to expect completeness in etching the plurality of layers by using a wet etching method.

In this case, the contact hole exposing the first active layer 121 by penetrating all of the first gate insulating layer 112, the first interlayer dielectric layer 113, the isolation insulating layer 140, and the second interlayer dielectric layer 115 further penetrates the isolation insulating layer 140, the first interlayer dielectric layer 113, and the first gate insulating layer 112 than the contact hole exposing the second active layer 131 by penetrating the second interlayer dielectric layer 115. When the contact hole exposing the first active layer 121 by penetrating all of the first gate insulating layer 112, the first interlayer dielectric layer 113, the isolation insulating layer 140, and the second interlayer dielectric layer 115 and the contact hole exposing the second active layer 131 by penetrating the second interlayer dielectric layer 115 are simultaneously formed through the dry etching, the portions of the second active layer 131 connected to the second source electrode 132 and the second drain electrode 133 may be damaged. For example, a part of the second active layer 131 may be removed by dry etching, and a physical defect may be formed on the surface of the second active layer 131. As a result, the characteristic of the element may deteriorate and reliability of the second thin film transistor 130 may deteriorate.

Accordingly, in the display device 100 according to the exemplary embodiment of the present disclosure, the first source electrode 122 and the connection source electrode 150 are not formed as one source electrode or the first drain electrode 123 and the connection drain electrode 151 are not formed as one drain electrode and the layers are separated into the first source electrode 122 and the first drain electrode 123, the connection source electrode 150, and the connection drain electrode 151 and generated as a double layer. For example, the first thin film transistor 120 and the second thin film transistor 130 are formed as separated layers. After the first source electrode 122 and the first drain electrode 123 of the first thin film transistor 120 are formed, the second active layer 131 of the second thin film transistor 130 is formed. As a result, the damage to the portions of the second active layer 131 connected to the second source electrode 132 and the second drain electrode 133 may be reduced. The damage to the portions of the second active layer 131 connected to the second source electrode 132 and the second drain electrode 133 is reduced so that element performance of the second thin film transistor 130 may be enhanced and furthermore, the reliability of the display device 100 according to the exemplary embodiment may be increased.

Meanwhile, the passivation layer 116 may be formed on the second interlayer dielectric layer 115, the connection source electrode 150, the connection drain electrode 151, the second source electrode 132, and the second drain electrode 133. The passivation layer 116 is an insulating layer for protecting the first thin film transistor 120 and the second thin film transistor 130. The passivation layer 116 may suppress hydrogen which is diffused from the tops of the first thin film transistor 120 and the second thin film transistor 130.

A planarization layer may be further disposed on the passivation layer 116, which is an insulating layer for planarizing the tops of the second thin film transistor 130, the connection source electrode 150, and the connection drain electrode 151. An organic light emitting element including an anode, an organic layer, and a cathode may be further disposed on the planarization layer. An encapsulating portion for suppressing moisture permeation may be further disposed on the organic light emitting element.

FIGS. 2A to 2D are cross-sectional views for describing a display device 100 according to an exemplary embodiment of the present disclosure. Referring to FIG. 1 for easy description, since the display device 100 illustrated in FIG. 2 is substantially the same as the display device 100 illustrated in FIG. 1, a duplicated description will be omitted.

Figure 2A:
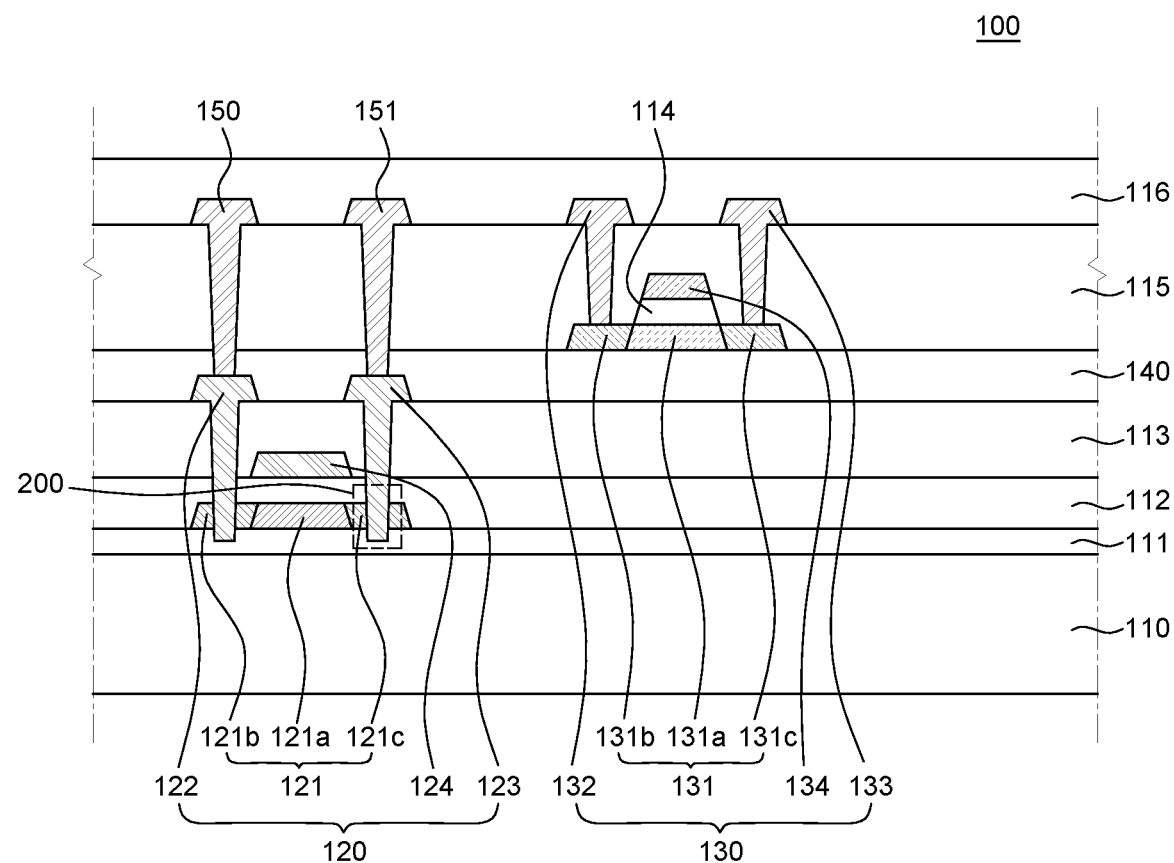
FIGS. 2A to 2D are cross-sectional views for describing a display device according to an exemplary embodiment of the present disclosure.

Referring to FIG. 2A, at least one of the first source electrode 122 and the first drain electrode 123 of the first thin film transistor 120 may contact the side of the first active layer 121 by penetrating the first active layer 121. It is illustrated in FIG. 2A that both of the first source electrode 122 and the first drain electrode 123 penetrate the first active layer 121, but only any one of the first source electrode 122 and the first drain electrode 123 may penetrate the first active layer 121. In detail, the first source electrode 122 and the first drain electrode 123 may be connected to the first active layer 121 while being extended to the interior of the buffer layer 111 by penetrating the first active layer 121. The contact hole exposing the first active layer by penetrating the first gate insulating layer 112 and the first interlayer dielectric layer 113 may expose an upper layer of the buffer layer 111 by further penetrating the first active layer 121. Further, the contact hole may be formed by removing a part of the upper layer of the buffer layer 111. For example, the contact hole may be formed by further removing a part of an upper layer of the buffer layer 111 while penetrating the first active layer 121. The first source electrode 122 and the first drain electrode 123 may be electrically connected to the first active layer 121 through the contact hole exposing the upper layer of the buffer layer 111 and the side of the first active layer 121 by penetrating the first interlayer dielectric layer 113, the first gate insulating layer 112, and the first active layer 121. Alternatively, the first source electrode 122 and the first drain electrode 123 may be electrically connected to the first active layer 121 through the contact hole exposing the side of the upper layer of the buffer layer 111 and the side of the first active layer 121 by penetrating the first interlayer dielectric layer 113, the first gate insulating layer 112, and the first active layer 121 and removing a part of the upper layer of the buffer layer 111.

Figure 2B:
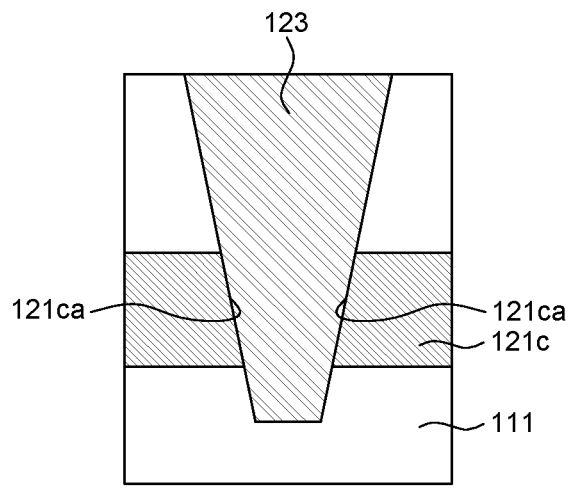
Figure 2C:
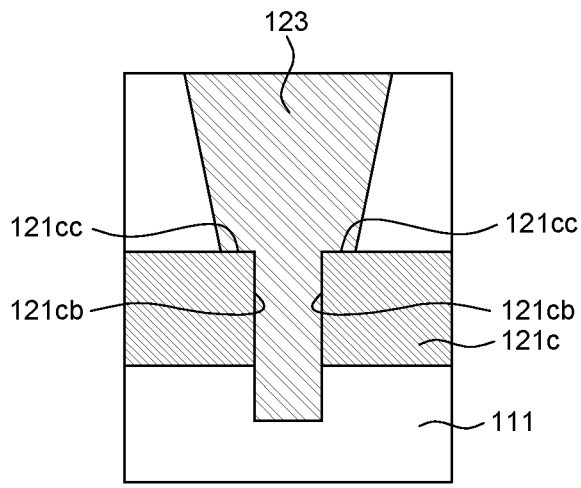
Figure 2D:
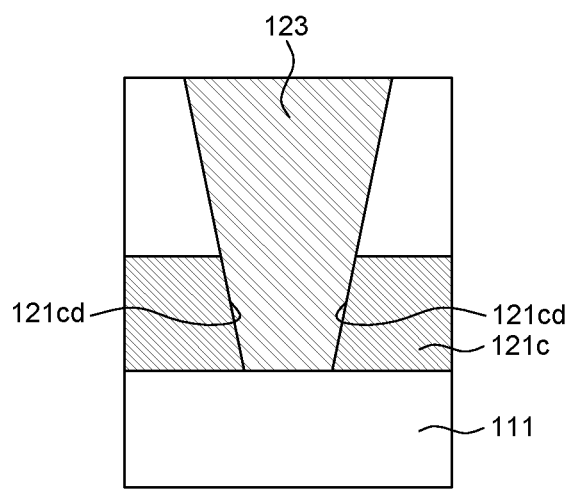

FIGS. 2B to 2D are enlarged cross-sectional views of a penetration part 200 of the first active layer 121 illustrated in FIG. 2A. A description of the cross-sectional views of FIGS. 2 B to 2D may be similarly applied even to a portion where the first source electrode 122 penetrates the first active layer 121.

Referring to FIG. 2B, the first drain region 121c of the first active layer 121 may be disposed on the buffer layer 111 and the first gate insulating layer 112 may be disposed on the first drain region 121c. The first drain electrode 123 may be electrically connected to the first drain region 121c of the first active layer 121 through the contact hole formed by penetrating the first gate insulating layer 112 and the first drain region 121c and removing a part of the upper layer of the buffer layer 111. In this case, the first drain electrode 123 is connected to the first active layer 121 by penetrating the first drain region 121c of the first active layer 121, and as a result, a cross-section where the first drain electrode 123 is in contact with the first drain region 121c may be widened. When the first drain electrode 123 does not penetrate the first active layer 121 as illustrated in FIG. 1, a portion where the first drain electrode 123 and the first drain region 121c are in contact with each other may correspond to a part of an upper surface of the first drain region 121c. Unlike this, when the first drain electrode 123 is connected to the first active layer 121 by penetrating the first drain region 121c as illustrated in FIG. 2B, the first drain electrode 123 may be further in contact with a lateral surface 121ca of the first active layer 121.

Referring to FIG. 2C, the first drain electrode 123 may be in contact with a lateral surface 121cb of the first active layer 121 and furthermore, may be further in contact with an upper surface 121cc of the first active layer 121. In this case, an upper surface of the first active layer 121 may be an upper surface extended from the lateral surface 121cb of the first active layer 121. Extents to which the first gate insulating layer 112 and the first active layer 121 are etched by the dry etching may be different from each other. For example, the first gate insulating layer 112 may be etched more than the first active layer 121. In this case, as illustrated in FIG. 2C, a diameter of the first active layer 121 etched by the dry etching in the process of forming the contact hole may be smaller than the diameter of the etched first gate insulating layer 112. Therefore, the upper surface 121cc of the first active layer 121 may be further exposed in addition to the lateral surface 121cb of the first active layer 121. As a contact hole exposing the upper surface 121cc of the first active layer 121 is formed, the first drain electrode 123 connected to the first active layer 121 may be in contact with the lateral surface 121cb of the first active layer 121 and the upper surface 121cc of the first active layer 121 through the contact hole. As a result, an area where the first drain electrode 123 and the first active layer 121 are in contact with each other may be further increased.

Referring to FIG. 2D, the first drain electrode 123 may be in contact with the lateral surface 121cd of the first active layer 121. The first drain electrode 123 may be electrically connected to the first drain region 121c of the first active layer 121 through the contact hole formed by penetrating the first gate insulating layer 112 and the first drain region 121c. In this case, after the contact hole penetrates the first drain region 121c, the buffer layer 111 may not be removed. The first drain electrode 123 may be in contact with the lateral surface 121cd of the first drain region 121c of the first active layer 121 through the contact hole formed through such a process.

According to the display device 100 according to the exemplary embodiment of the present disclosure, at least one electrode of the first source electrode 122 and the first drain electrode 123 is connected to the first active layer 121 by penetrating the first active layer 121 to enhance element reliability of the first thin film transistor 120. Specifically, when the contact hole exposing the first active layer 121 is formed by using the dry etching, the surface of the first active layer 121 may be damaged or defective. The element reliability of the first thin film transistor 120 may be reduced due to damage and defects on the surface of the first active layer 121 and furthermore, the reliability of the display device 100 may also be reduced. When the first drain electrode 123 is connected to the first active layer 121 by penetrating the first active layer 121, the surface damaged by the dry etching may not be the surface of an upper portion of the first active layer 121 but a part of the surface of an upper layer of the buffer layer 111. Consequently, a damage degree of a portion where the first active layer 121 and the first drain electrode 123 are in contact with each other may be reduced and the element reliability of the first thin film transistor 120 may be enhanced. Further, when the first drain electrode 123 is connected to the first active layer 121 by penetrating the first active layer 121, the cross-section of the portion where the first drain electrode 123 and the first active layer 121 are in contact with each other may increase. As the first drain electrode 123 is connected to the first active layer 121 by penetrating the first active layer 121, the area where the first drain electrode 123 and the first active layer 121 are in contact with each other increases. And a response and an operation speed of the first thin film transistor 120 increase to enhance the element reliability.

Further, as described above in FIG. 1, the first source electrode 122 and the first drain electrode 123 of the display device 100 and the connection source electrode 150 and the connection drain electrode 151 of the display device 100 may not be formed as one source electrode and one drain electrode but separately formed. For example, after the first thin film transistor 120 is formed, the second thin film transistor 130 may be formed on a different layer from the first thin film transistor 120. Therefore the first source electrode 122 and the first drain electrode 123 may be formed separately from the connection source electrode 150 and the connection drain electrode 151. Unlike this, the first source electrode 122 and the connection source electrode 150 may be formed as one electrode, and the first drain electrode 123 and the connection drain electrode 151 may be formed as one electrode. In this case, since the contact hole is formed by the dry etching as described above, the second active layer 131 may be damaged. When the first source electrode 122 and the first drain electrode 123 are formed so as to be connected to the first active layer 121 by penetrating the first active layer 121, the damage degree of the second active layer 131 may further increase. For example, when the contact hole exposing the first active layer 121 is formed through the dry etching, the upper layers of the first active layer 121 and the buffer layer 111 may be further etched. As a result, in the display device 100 and the method for manufacturing the same according to the exemplary embodiments of the present disclosure, the first source electrode 122 and the first drain electrode 123 of the first thin film transistor 120 are formed before the second active layer 131 of the second thin film transistor 130 is formed and the first thin film transistor 120 is isolated from the second thin film transistor 130 to be generated on a different layer, and as a result, the damage to the second active layer 131 may be reduced even when the first source electrode 122 and the first drain electrode 123 are connected to the first active layer 121 by penetrating the first active layer 121.

Figure 3:
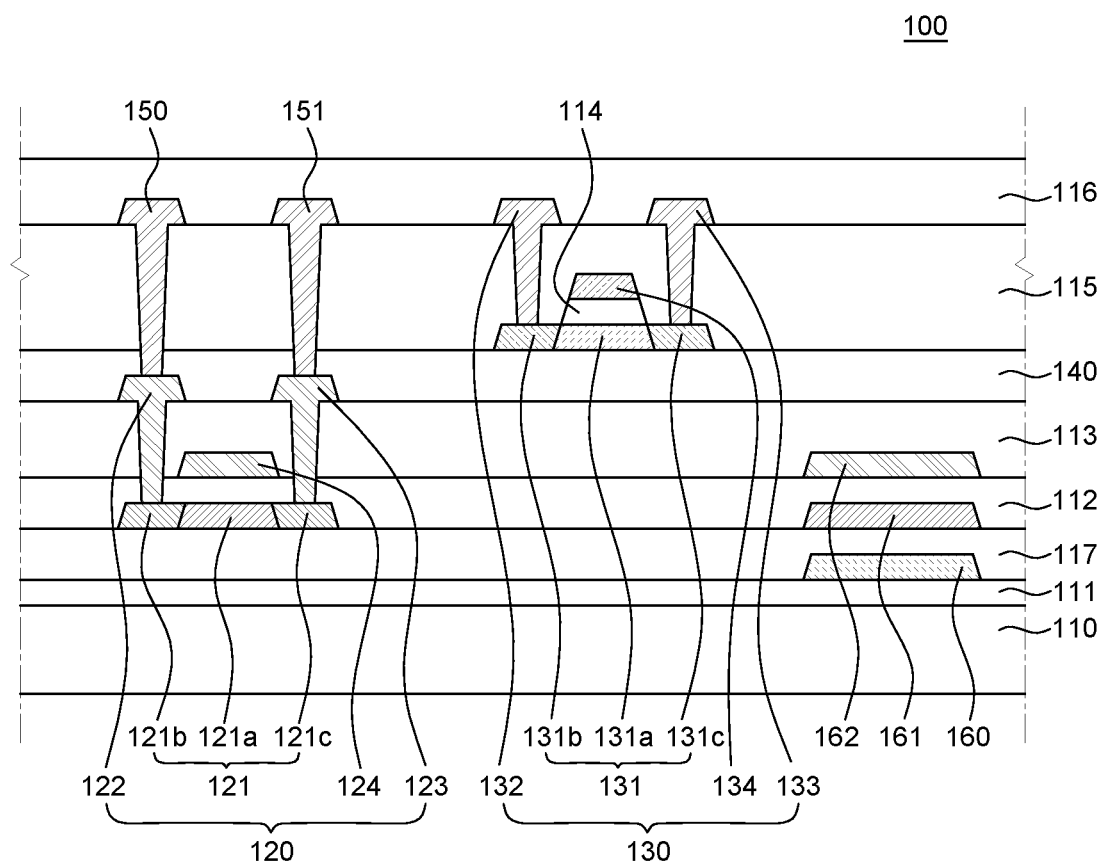
FIG. 3 is a cross-sectional view for describing a display device according to an exemplary embodiment of the present disclosure.

FIG. 3 is a cross-sectional view for describing a display device according to an exemplary embodiment of the present disclosure. The display device is described with reference to FIG. 1 for easy description and since the display device 100 illustrated in FIG. 3 is substantially the same as the display device 100 illustrated in FIG. 1 except an additional buffer layer 117, a first touch electrode 160, a second touch electrode 161, and a third touch electrode 162 are added, a duplicated description will be omitted.

Referring to FIG. 3, the additional buffer layer 117 may be formed on the buffer layer 111. The additional buffer layer 117 may be configured by a single layer of silicon nitride (SiNx) or silicon oxide (SiOx), or multiple layers of silicon nitride (SiNx) and silicon oxide (SiOx). The first touch electrode 160 may be formed on a part of the buffer layer 111. The additional buffer layer 117 may be positioned below the first thin film transistor 120. Further, the second touch electrode 161 may be formed on the same layer as the first active layer 121 to be spaced apart from the first active layer 121. The second touch electrode 161 may be formed on the additional buffer layer 117 while overlapping with the first touch electrode 160. The third touch electrode 162 may be formed on the same layer as the first gate electrode 124 of the first thin film transistor 120. The third touch electrode 162 may be formed on the first gate insulating layer 112 while overlapping with the first touch electrode 160 and the second touch electrode 161. The first touch electrode 160, the second touch electrode 161, and the third touch electrode 162 may serve as an electrode for measuring the intensity of touch pressure applied to the display device.

The display device may further include a touch pad therein and when a user of the display device applies a touch input to the surface of the display device, the first touch electrode 160, the second touch electrode 161, and the third touch electrode 162 may measure the intensity of the applied touch input. Specifically, first capacitance may be formed between the first touch electrode 160 and the second touch electrode 161 and second capacitance may be formed between the second touch electrode 161 and the third touch electrode 162. When the touch input of the user of the display device is applied, an electric field between the first touch electrode 160 and the second touch electrode 161 may be changed by pressure which the user applies to a touch panel, and as a result, the first capacitance between the first touch electrode 160 and the second touch electrode 161 is changed. Similarly, when the touch input of the user of the display device is applied, the electric field between the second touch electrode 161 and the third touch electrode 162 may be changed by the pressure which the user applies to the touch panel, and as a result, the second capacitance between the second touch electrode 161 and the third touch electrode 162 is changed. The display device may sense the changes of the first capacitance and the second capacitance.

In the display device 100 and the method for manufacturing the same according to the exemplary embodiments of the present disclosure, the touch electrode that senses the touch input of the user is formed on the layer where the first thin film transistor 120 is formed to reduce a thickness of the display device. For example, in the display device in the related art, the touch electrode may be positioned on the first thin film transistor 120 and the second thin film transistor 130. As a result, an additional insulating layer for insulating the touch electrode from the second thin film transistor 130 may be formed in order to form the touch electrode. The thickness of the display device may be increased by the thickness of the touch electrode and the additionally formed insulating layer. In the display device 100 of the present disclosure, the second touch electrode 161 is formed on the layer where the first active layer 121 of the first thin film transistor 120 is formed and the third touch electrode 162 is formed on the same layer as the gate electrode 124 of the first thin film transistor 120. As a result, the touch electrode may be implemented without forming the additional insulating layer. The additional buffer layer 117 may be disposed in order to form base shield metal (BSM) which may serve to protect the first active layer 121 of the first thin film transistor 120 below the first active layer 121. The first touch electrode 160 may be formed on the same layer as the base shield metal (BSM). Therefore, in the display device 100 and the method for manufacturing the same according to the exemplary embodiments of the present disclosure, the touch electrode that senses the touch input of the user is formed on the layer where the first thin film transistor 120 is formed to reduce the thickness of the display device.

Figure 4:
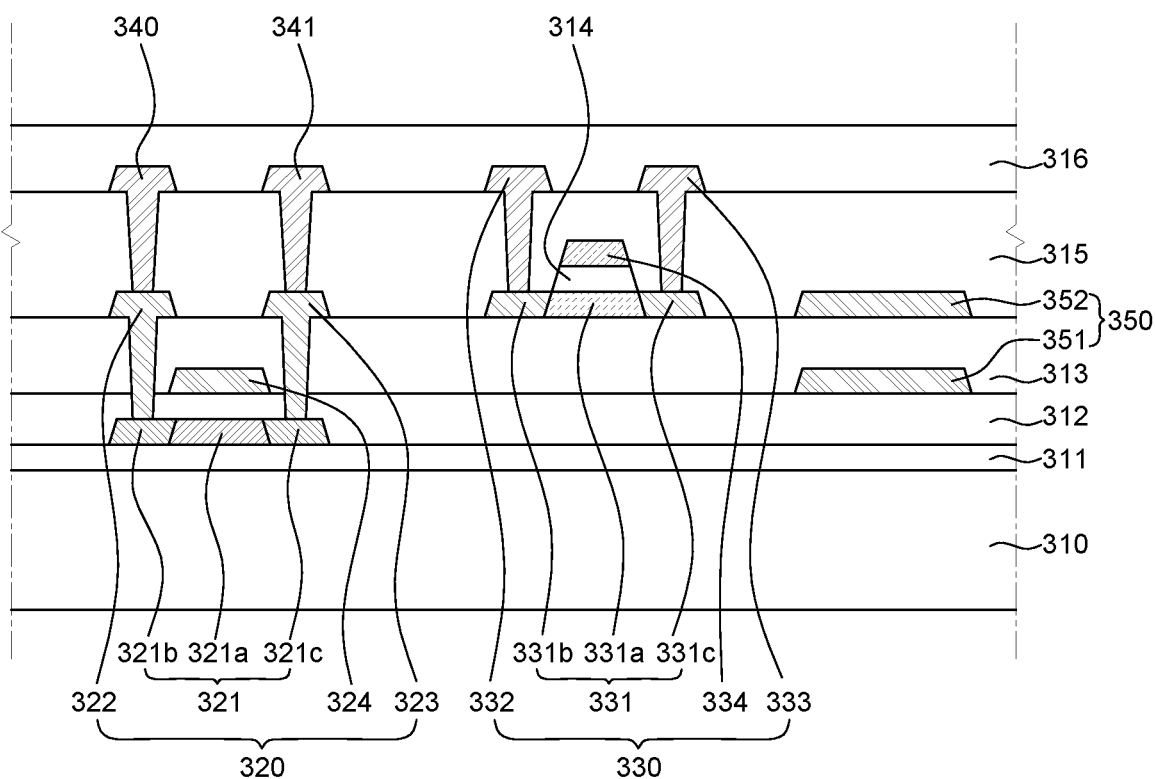
FIG. 4 is a cross-sectional view for describing a display device according to another exemplary embodiment of the present disclosure.

FIG. 4 is a cross-sectional view for describing a display device 300 according to another exemplary embodiment of the present disclosure. The display device 300 is described with reference to FIG. 1 for easy description and the duplicated description will be omitted. In detail, the first thin film transistor 120 and the second thin film transistor 130 of FIG. 1 are substantially the same as a first thin film transistor 320 and a second thin film transistor 330 of FIG. 4. Further, the substrate 110, the buffer layer 111, the connection source electrode 150, the connection drain electrode 151, and the passivation layer 116 of FIG. 1 are substantially the same as a substrate 310, a buffer layer 311, a connection source electrode 340, a connection drain electrode 341, and a passivation layer 316 of FIG. 4. Therefore, the duplicated description of the configuration of FIG. 4 which is substantially the same as FIG. 1 will be omitted.

Referring to FIG. 4, the display device 300 according to another exemplary embodiment of the present disclosure includes the substrate 310, the buffer layer 311, a first thin film transistor 320, a second thin film transistor 330, a first gate insulating layer 312, a first interlayer dielectric layer 313, a second interlayer dielectric layer 315, the passivation layer 316, the connection source electrode 340, and the connection drain electrode 341. Further, a first active layer 321 of the first thin film transistor 320 may be made of the LTPS and a second active layer 331 of the second thin film transistor 330 may be made of the oxide semiconductor.

Referring to FIG. 4, the display device 300 according to another exemplary embodiment of the present disclosure does not include the isolation insulating layer 140 unlike the display device 100 according to the exemplary embodiment of the present disclosure. Further, a first source electrode 322 and a first drain electrode 323 may be connected to the first active layer 321 through a first contact hole exposing the first active layer 321 by penetrating the first gate insulating layer 312 and the first interlayer dielectric layer 313. The first source electrode 322, the first drain electrode 323, and the second active layer 331 may be positioned on the first interlayer dielectric layer 313.

The first source electrode 322 and the first drain electrode 323 may be made of the semiconductor material, which is conductivized. In the case of the display device 300 according to another exemplary embodiment of the present disclosure, the first source electrode 322 and the first drain electrode 323 may be generated through a process of forming the semiconductor material on the first interlayer dielectric layer 313 and thereafter, patterning and conducting the formed semiconductor material. As the semiconductor material is conductivized, the first source electrode 322 and the first drain electrode 323 may have an offset resistance value of 1 to 2Ω. The offset resistance values of the first source electrode 322 and the first drain electrode 323 may be measured in order to determine conductivity of the first source electrode 322 and the first drain electrode 323. In this case, the offset resistance values of the first source electrode 322 and the first drain electrode 323 may be measured as 1 to 2Ω and in this case, it may be determined that the first source electrode 322 and the first drain electrode 323 may serve as the source electrode and the drain electrode of the thin film transistor through the offset resistance value of 1 to 2Ω.

The first source electrode 322 and the first drain electrode 323 may be generated simultaneously with the second active layer 331. Specifically, the semiconductor material may be formed on the first interlayer dielectric layer 313, and the formed semiconductor material may be patterned. The semiconductor material simultaneously patterned as described above may be formed as the first source electrode 322 and the first drain electrode 323 through a conducting process of the semiconductor material. Therefore, the first source electrode 322 and the first drain electrode 323 may be made of the same material as conductivized portions of the second active layer 331, which are connected to the second source electrode 332 and the second drain electrode 333, respectively. For example, second source regions 331b and second drain regions 331c of the second active layer 331 and the first source electrode 322 and the first drain electrode 323 may be made of the same material. Therefore, the first source electrode 322 and the first drain electrode 323 may be made of a different material from the second source electrode 332 and the second drain electrode 333. Specifically, the first source electrode 322 and the first drain electrode 323 may be made of the semiconductor material which is conductivized. Unlike this, the second source electrode 332 and the second drain electrode 333 may be made of the metal material which is a conductor.

Further, in the display device 300 and the method for manufacturing the same according to another exemplary embodiment of the present disclosure, the first source electrode 322 and the first drain electrode 323 are made of the conductivized semiconductor material to reduce the number of masks used during a manufacturing process of the display device 300. Specifically, since the first source electrode 322 and the first drain electrode 323 may be made of the conductivized semiconductor material, the first source electrode 322 and the first drain electrode 323 may be formed simultaneously with the second active layer 331. When the first source electrode 322, the first drain electrode 323, and the second active layer 331 are simultaneously formed, the first source electrode 322, the first drain electrode 323, and the second active layer 331 may be formed by not two separated masks but one mask. As a result, an effect of reducing the number of masks required for the manufacturing process of the display device 300 may be achieved. Therefore, in the display device 300 and the method for manufacturing the same according to another exemplary embodiment of the present disclosure, as the number of masks used for the process is reduced, production process cost and a process time of the display device 300 may be significantly reduced.

Further, the first source electrode 322, the first drain electrode 323, and the second active layer 331 are formed on the first interlayer dielectric layer 313 which is the same layer, and as a result, the isolation insulating layer 140 illustrated in FIG. 1 may not be formed. As the isolation insulating layer 140 is not formed, the thickness of the display device 300 may decrease. Furthermore, the damage to the second active layer 331 may be reduced, which occurs while forming a second contact hole exposing the first source electrode 322 and the first drain electrode 323 and a third contact hole exposing the second active layer 331. The connection source electrode 340 and the connection drain electrode 341 may be connected to the first source electrode 322 and the first drain electrode 323, respectively by penetrating only the second interlayer dielectric layer 315 except for the isolation insulating layer. Therefore, all of the connection source electrode 340, the connection drain electrode 341, the second source electrode 332, and the second drain electrode 333 may penetrate the second interlayer dielectric layer 315. For example, all of the connection source electrode 340, the connection drain electrode 341, the second source electrode 332, and the second drain electrode 333 may penetrate a layer having the same thickness corresponding to the thickness of the second interlayer dielectric layer 315. As a result, when the second contact hole exposing the first source electrode 322 and the first drain electrode 323 and the third contact hole exposing the second active layer 331 are formed through the dry etching, the isolation insulating layer 140 illustrated in FIG. 1 need not be further etched, and as a result, the damage to the surface of the second active layer 331 may be further reduced. As a surface damage degree of the second active layer 331 decreases, the element performance of the second thin film transistor 330 increases to increase the reliability of the display device 300 according to another exemplary embodiment of the present disclosure.

Meanwhile, referring to FIG. 4, the storage capacitor 350 may include a first electrode 351 disposed on the first gate insulating layer 312 and a second electrode 352 disposed on the first interlayer dielectric layer 313. The first electrode 351 may be disposed on the first gate insulating layer 312 and formed in the same process step as the first gate electrode 324 of the first thin film transistor 320. For example, metal is formed on the first gate insulating layer 312 and patterned to form the first gate electrode 324 and the first electrode 351. As a result, the first gate electrode 324 and the first electrode 351 may be made of the same material, and the thicknesses of the first gate electrode 324 and the first electrode 351 may be the same as each other.

The second electrode 352 of the storage capacitor 350 may be formed on the first interlayer dielectric layer 313. In this case, the second electrode 352 may be made of the same material as the first source electrode 322 and the first drain electrode 323. For example, after the semiconductor material is formed on the first interlayer dielectric layer 313, the semiconductor material is simultaneously patterned and conductivized, and as a result, the first source electrode 322, the first drain electrode 323, the second active layer 331, and the second electrode 352 may be simultaneously formed. Since the second electrode 352 of the storage capacitor 350 is formed at the same time as the first source electrode 322, the first drain electrode 323, and the second active layer 331, the display device 300 according to another exemplary embodiment of the present disclosure and the method for manufacturing the same may reduce the number of used masks. Specifically, additional masks may be used to form the second electrode 352 of the storage capacitor 350. As a result, cost of generating the display device 300 increases as the total number of masks increases. However, in the display device 300 of the present disclosure, the second electrode 352 is made of the same material as the first source electrode 322 and the first drain electrode 323, f or example, the conductivized semiconductor material and additional mask forming the second electrode 352 is not thus used, and as a result, there is efficiency in terms of the process cost and the process time.

Further, the electrode of the storage capacitor 350 generally made of the metal is made of the conductivized semiconductor material, and as a result, the electrode of the storage capacitor 350 may be additionally formed on the layer where the second active layer 331 is formed. As a result, the capacitance of the storage capacitor 350 may effectively increase.

Figure 5:
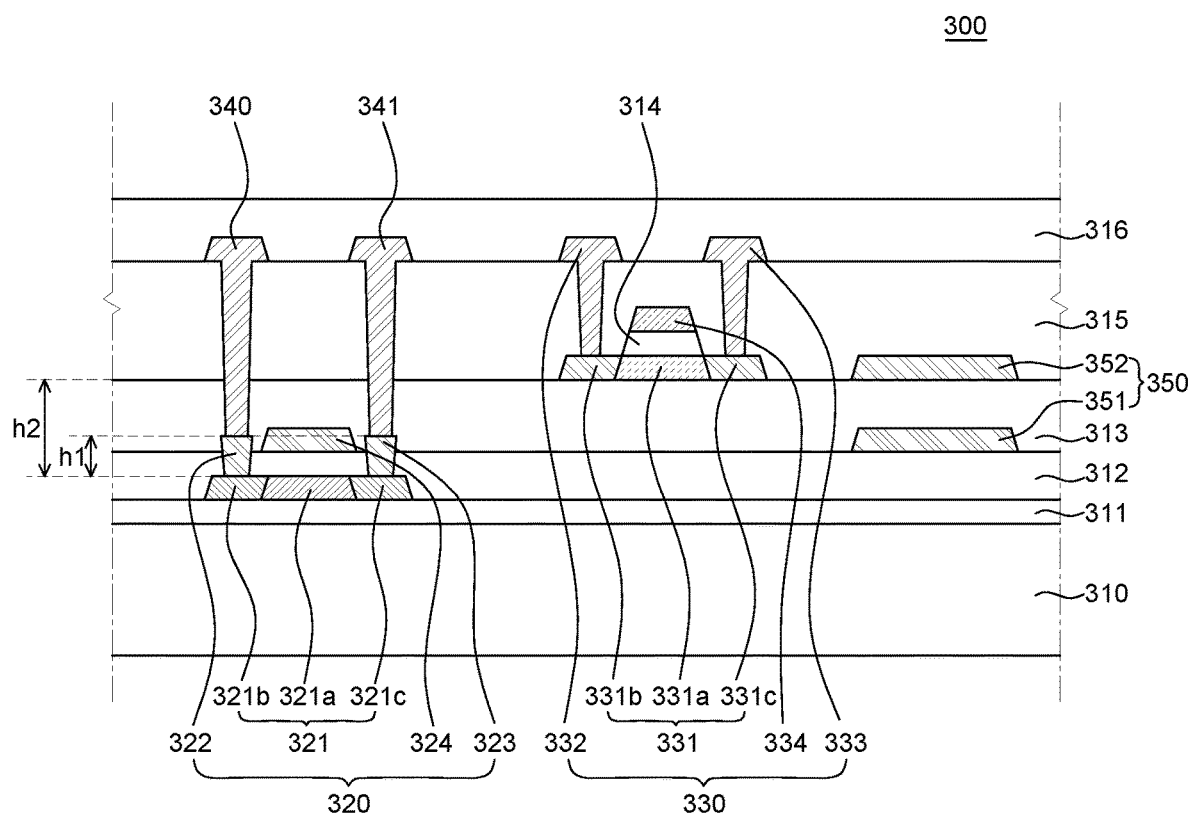
FIG. 5 is a cross-sectional view for describing a display device according to another exemplary embodiment of the present disclosure.

FIG. 5 is a cross-sectional view for describing a display device 300 according to another exemplary embodiment of the present disclosure. The display device 300 is described with reference to FIG. 4 for easy description and the duplicated description will be omitted.

Referring to FIG. 5, a height from an upper end of the first active layer 321 up to the upper end of the first interlayer dielectric layer 313 may be greater than a height from the upper end of the first active layer 321 up to the upper ends of the first source electrode 322 and the first drain electrode 323. Specifically, the upper ends of the first source electrode 322 and the first drain electrode 323 may be disposed to be lower than the upper end of the first interlayer dielectric layer 313. Therefore, a height h1 from the upper end of the first active layer 321 up to the upper ends of the first source electrode 322 and the first drain electrode 323 may be smaller than a height h2 from the upper end of the first active layer 321 up to the upper end of the first interlayer dielectric layer 313. In this case, the connection source electrode 340 and the connection drain electrode 341 may penetrate the second interlayer dielectric layer 315. Furthermore, the connection source electrode 340 and the connection drain electrode 341 may penetrate the entirety or a part of the first interlayer dielectric layer 313. Alternatively, the connection source electrode 340 and the connection drain electrode 341 may penetrate the second interlayer dielectric layer 315, the first interlayer dielectric layer 313, and a part of the first gate insulating layer 312. The first source electrode 322 and the first drain electrode 323 may be formed in a lower portion of the first contact hole exposing the first active layer 321 by penetrating the first interlayer dielectric layer 313 and the first gate insulating layer 312. For example, the first contact hole exposing the first active layer 321 may be formed and then the semiconductor material for the first source electrode 322, the first drain electrode 323, the second active layer 331, and the second electrode 352 of the storage capacitor 350 may be formed.

In this case, the semiconductor material may fill not the entirety of the first contact hole, exposing the first active layer 321 by penetrating the first gate insulating layer 312 and the first interlayer dielectric layer 313, but only a lower portion of the first contact hole. The first source electrode 322, the first drain electrode 323, a part of the second active layer 331, and the second electrode 352 comprise of the conductivized semiconductor material. The connection source electrode 340 and the connection drain electrode 341 may be electrically connected to the first source electrode 322 and the first drain electrode 323, respectively through the second contact hole formed by removing the second interlayer dielectric layer 315. The second contact hole exposing the first source electrode 322 and the first drain electrode 323 may extend deeper than the corresponding second contact hole illustrated in FIG. 4. The second contact hole exposing the first source electrode 322 and the first drain electrode 323 may be formed simultaneously with the third contact hole exposing the second active layer 331. Further, the connection source electrode 340 and the connection drain electrode 341 may be formed at the same time as the second source electrode 332 and the second drain electrode 333. For example, the connection source electrode 340 and the connection drain electrode 341 may be formed by the same process as the second source electrode 332 and the second drain electrode 333.

In the display device 300 according to another exemplary embodiment of the present disclosure and the method for manufacturing the same, the height h2 from the upper end of the first active layer 321 up to the upper end of the first interlayer dielectric layer 313 is greater than the height h1 from the upper end of the first active layer 321 up to the upper ends of the first source electrode 322 and the first drain electrode 323 to enhance conductivity of the first source electrode 322 and the first drain electrode 323. Specifically, when the first source electrode 322 and the first drain electrode 323 may be made of the conductivized semiconductor material, conductivity of the first source electrode 322 and the first drain electrode 323 may decrease. Since a doping process of the semiconductor to be conducting may be performed from the upper portion of the semiconductor material to the lower portion of the semiconductor material, a conductivity of lower portion of the first source electrode 322 and the first drain electrode 323 may be lower than a conductivity of upper portion of the first source electrode 322 and the first drain electrode 323. For example, there is a possibility that the conductivity of the first source electrode 322 and the first drain electrode 323 will be uneven in overall.

When the conductivity of the first source electrode 322 and the first drain electrode 323 will be uneven in overall, the first active layer 321 may not be completely electrically connected to each of the first source electrode 322 and the first drain electrode 323. Therefore, the upper surfaces of the first source electrode 322 and the first drain electrode 323 is formed to be lower than the upper surface of the first interlayer dielectric layer 313, and the thinned semiconductor material is conductivized to form the first source electrode 322 and the first drain electrode 323. As a result, the conductivity of the first source electrode 322 and the first drain electrode 323 may be improved, and the reliability of the first thin film transistor 320 may be increased.

Figure 6:
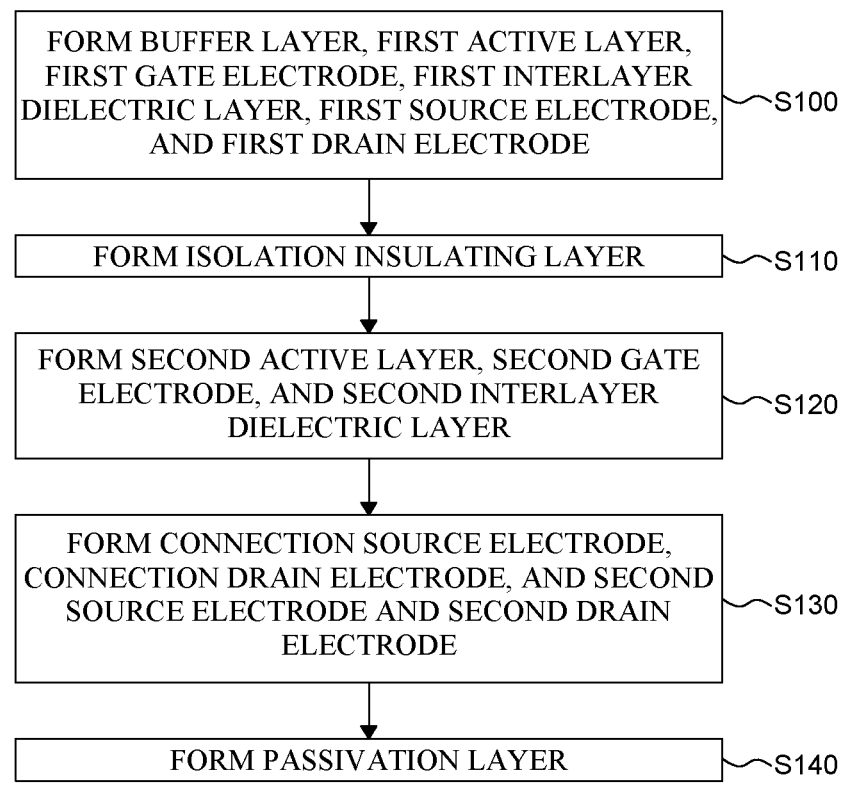
FIG. 6 is a schematic flowchart for describing a method for manufacturing a display device according to an exemplary embodiment of the present disclosure.

FIG. 6 is a schematic flowchart for describing a method for manufacturing a display device according to an exemplary embodiment of the present disclosure. FIGS. 7A to 7G are process cross-sectional views illustrating the method for manufacturing the display device according to the exemplary embodiment of the present disclosure. FIGS. 6, and 7A to 7G are a flowchart and process cross-sectional views for describing the method for manufacturing the display device 100 according to the exemplary embodiment of the present disclosure illustrated in FIG. 1.

First, on the substrate 110, the buffer layer 111, the first active layer 121, the first gate electrode 124, the first interlayer dielectric layer 113, the first source electrode 122, and the first drain electrode 123 are formed (S100).

Figure 7A:
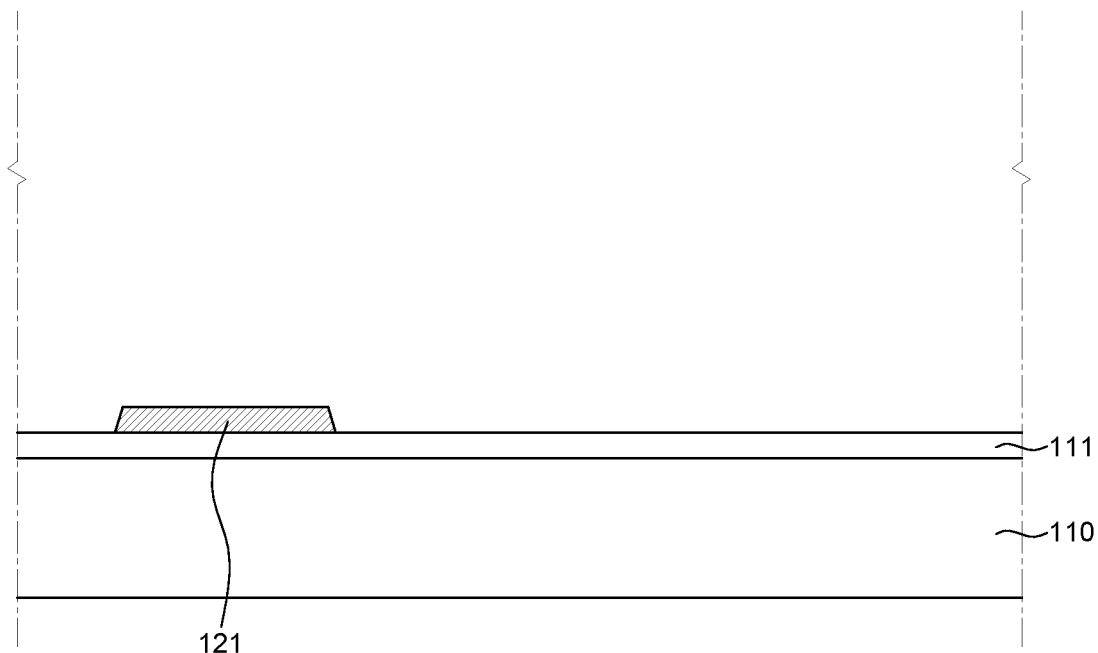
FIGS. 7A to 7G are process cross-sectional views for describing a method for manufacturing a display device according to an exemplary embodiment of the present disclosure.

Referring to FIG. 7A, the buffer layer 111 is deposited on the surface of the substrate 110. Specifically, the single-layered buffer layer 111 may be formed by depositing either silicon nitride (SiNx) or silicon oxide (SiOx), or the multi-layered buffer layer 111 may be formed by stacking alternately silicon nitride (SiNx) and silicon oxide (SiOx).

Subsequently, the first active layer 121 of the first thin film transistor 120 is formed on the buffer layer 111. An amorphous silicon (a-Si) material is deposited on the surface of the buffer layer 111 to form an a-Si layer, and a dehydrogenation process for the a-Si layer is performed. If a large amount of hydrogen is present in the a-Si layer, hydrogen in the a-Si layer may explode in a subsequent process, and thus defects may occur. Thus, the dehydrogenation process is a process of removing hydrogen from the a-Si layer, which is performed after the a-Si layer is formed. After the dehydrogenation process is completed, a crystallization process for the a-Si layer is performed. The crystallization process is a process for crystallizing amorphous silicon (a-Si) in the a-Si layer to form polysilicon, and may be performed, for example, through an excimer laser annealing (ELA) process. Subsequently, in order to form the first active layer of the first thin film transistor 120, the crystallized a-Si layer is patterned.

Figure 7B:
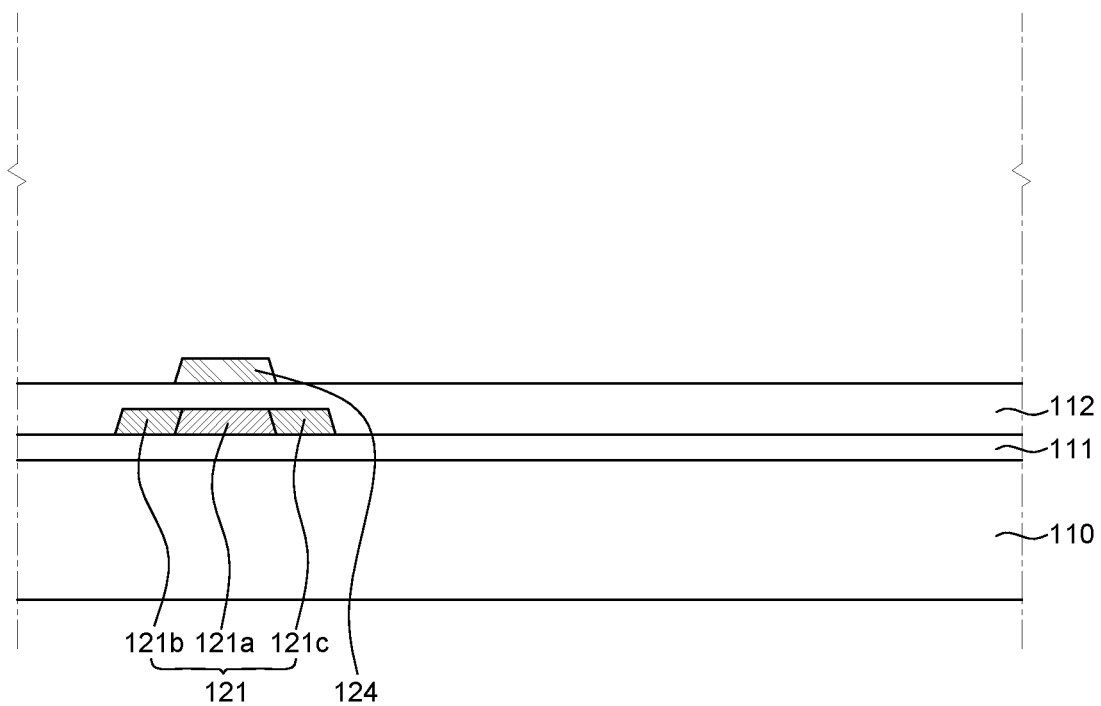

Referring to FIG. 7B, the first gate insulating layer 112 of the first thin film transistor 120 is formed on the first active layer 121 of the first thin film transistor 120. Particularly, any one of silicon nitride (SiNx) and silicon oxide (SiOx) is deposited to form the single-layered first gate insulating layer 112 of the first thin film transistor 120, or silicon nitride (SiNx) and silicon oxide (SiOx) may be alternately stacked to form the multilayered first gate insulating layer 112 of the first thin film transistor 120.

Subsequently, the first gate electrode 124 of the first thin film transistor 120 is formed by depositing a material for the gate electrode on the first gate insulating layer 112 and patterning the material for the gate electrode. The material for the gate electrode may be various metal materials such as molybdenum (Mo) and the like.

Subsequently, a doping process for the first active layer 121 of the first thin film transistor 120 is performed using the first gate electrode 124 of the first thin film transistor 120 as a mask. A first source region 121b and a first drain region 121c of the first active layer 121 may be defined by injecting impurities into the first active layer 121 disposed below using the first gate electrode 124 as a mask. The definition process of the doped region may vary depending on a P-MOS thin film transistor, an N-MOS thin film transistor, or a C-MOS thin film transistor. For example, in the case of an N-MOS thin film transistor, a high density doping area may be formed first, and then a low density doping area may be formed later. Specifically, after the high density doping area is defined by using a photoresist having a size larger than that of the first gate electrode 124 of the first thin film transistor 120, the photoresist is removed and the first gate electrode 124 is used as a mask to define the low density doping area (LDD). In some exemplary embodiments, the first source region 121b and the first drain region 121c may be formed before forming the first gate insulating layer 112 of the first thin film transistor 120. Immediately after forming the first active layer 121, impurities may be doped using the photoresist.

Figure 7C:
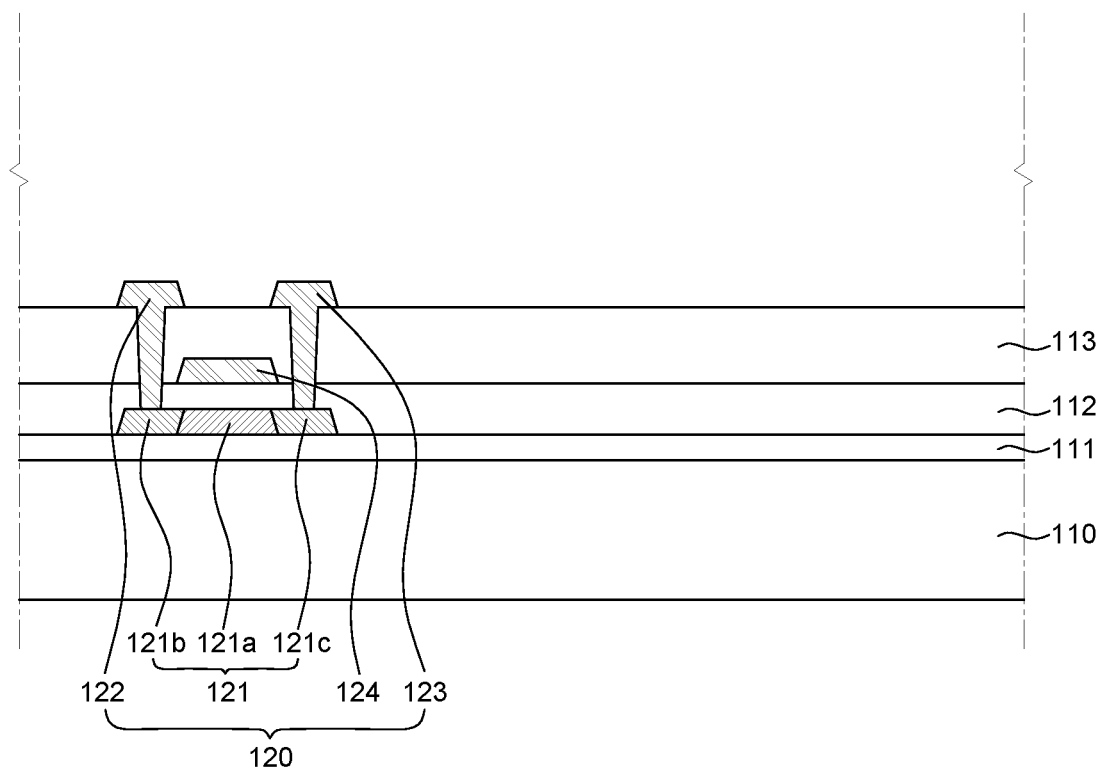

Referring to FIG. 7C, the first interlayer dielectric layer 113 of the first thin film transistor 120 is formed on the first gate electrode 124 of the first thin film transistor 120. The first interlayer dielectric layer 113 may be formed by depositing silicon nitride (SiNx) on the first gate electrode 124 of the first thin film transistor 120. The first interlayer dielectric layer 113 is made of silicon nitride (SiNx) to provide hydrogen to the first active layer 121 during the hydrogenation process for the first active layer 121 of the first thin film transistor 120.

Subsequently, a contact hole that exposes the first active layer 121 of the first thin film transistor 120 by passing through the first gate insulating layer 112 and the first interlayer dielectric layer 113 of the first thin film transistor 120 is formed. In addition, the first source electrode 122 and the first drain electrode 123 of the first thin film transistor 120 are formed in the contact hole. The first source electrode 122 and the first drain electrode 123 may be formed by depositing and patterning materials for the source electrode and the drain electrode on the first interlayer dielectric layer 113. At this time, the first source electrode 122 and the first drain electrode 123 may have a three-layer structure of titanium (Ti)/aluminum (Al)/titanium (Ti), and a patterning process may be performed through dry etching.

Subsequently, an isolation insulating layer 140 may be formed on the first thin film transistor 120 (S110).

Figure 7D:
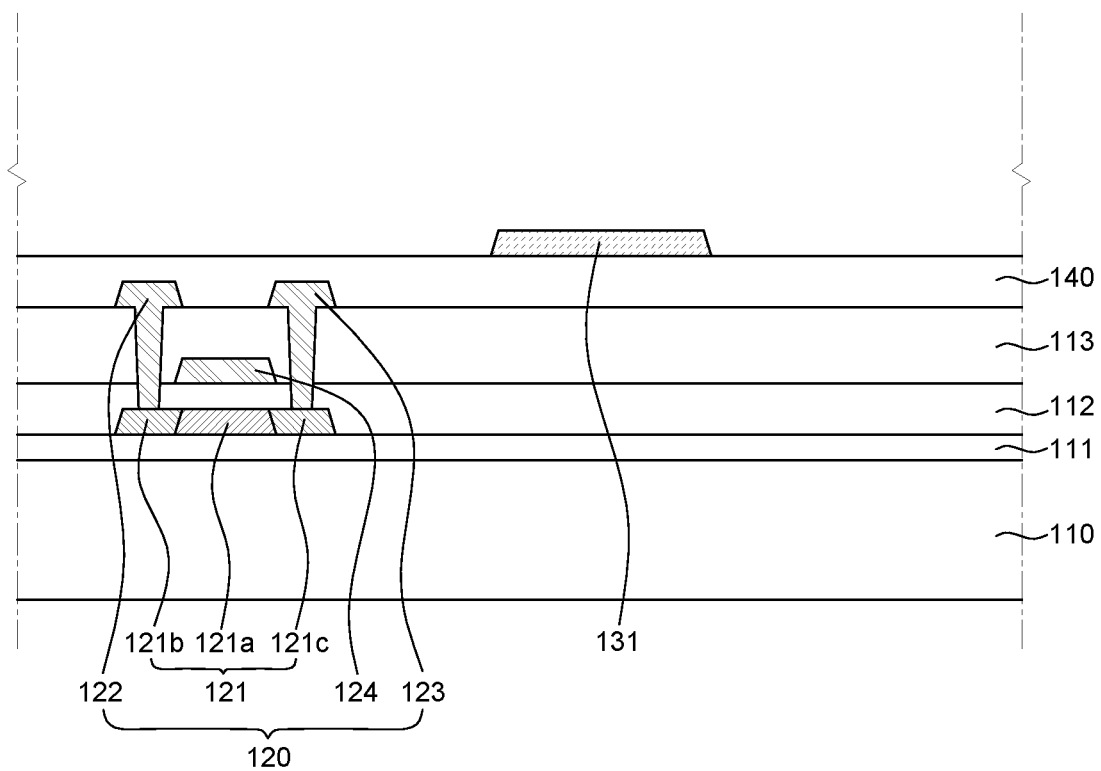

Referring to FIG. 7D, a single-layered isolation insulating layer 140 may be formed by depositing either silicon nitride (SiNx) or silicon oxide (SiOx), or a multilayered isolation insulating layer 140 may be formed by stacking alternately silicon nitride (SiNx) and silicon oxide (SiOx). The isolation insulating layer 140 may be formed on the first source electrode 122 and the first drain electrode 123 of the first thin film transistor 120 and the first interlayer dielectric layer 113. The isolation insulating layer 140 means an insulating layer in which the first thin film transistor 120 formed below the isolation insulating layer 140 and the second thin film transistor 130 formed on the isolation insulating layer 140 are isolated from each other by the insulating layer.

Next, a second active layer 131, a second gate electrode 134, and a second interlayer dielectric layer 115 may be formed on the isolation insulating layer 140 (S120).

The second active layer 131 of the second thin film transistor 130 may be formed on the isolation insulating layer 140. The second active layer 131 may be formed by depositing a metal oxide, for example, indium-gallium-zinc-oxide (IGZO), indium-zinc-oxide (IZO), or indium-gallium-oxide (IGO), on the isolation insulating layer 140. The second active layer 131 of the second thin film transistor 130 is formed based on the IGZO layer on the assumption that the second active layer 131 is made of IGZO among various metal oxides, but is not limited thereto, and the second active layer 131 may be formed of a metal oxide other than IGZO. The IGZO deposition is performed at a high temperature. Accordingly, IGZO may be crystallized during the IGZO deposition process. When IGZO is deposited at room temperature, IGZO may be an amorphous state, but when IGZO is deposited at a high temperature, indium (In), gallium (Ga), and zinc (Zn) form a layered structure to form a network. Further, as the crystallization proceeds at a high temperature, the oxygen pores in the IGZO layer are reduced. When a large amount of oxygen pores exist in the IGZO layer, a tunneling phenomenon occurs and thus, the IGZO layer is electrically conductivized, and as a result, as crystallization proceeds at a high temperature during IGZO deposition, bias and temperature stress (BTS) characteristics of the second thin film transistor 130 are improved and the reliability may be increased. Next, for stabilization of the IGZO layer, the second active layer 131 is formed by heat-treating the IGZO layer and patterning the IGZO layer. The second source region 131b and the second drain region 131c of the second active layer 131 may be formed by ion-doping a oxide semiconductor material.

Figure 7E:
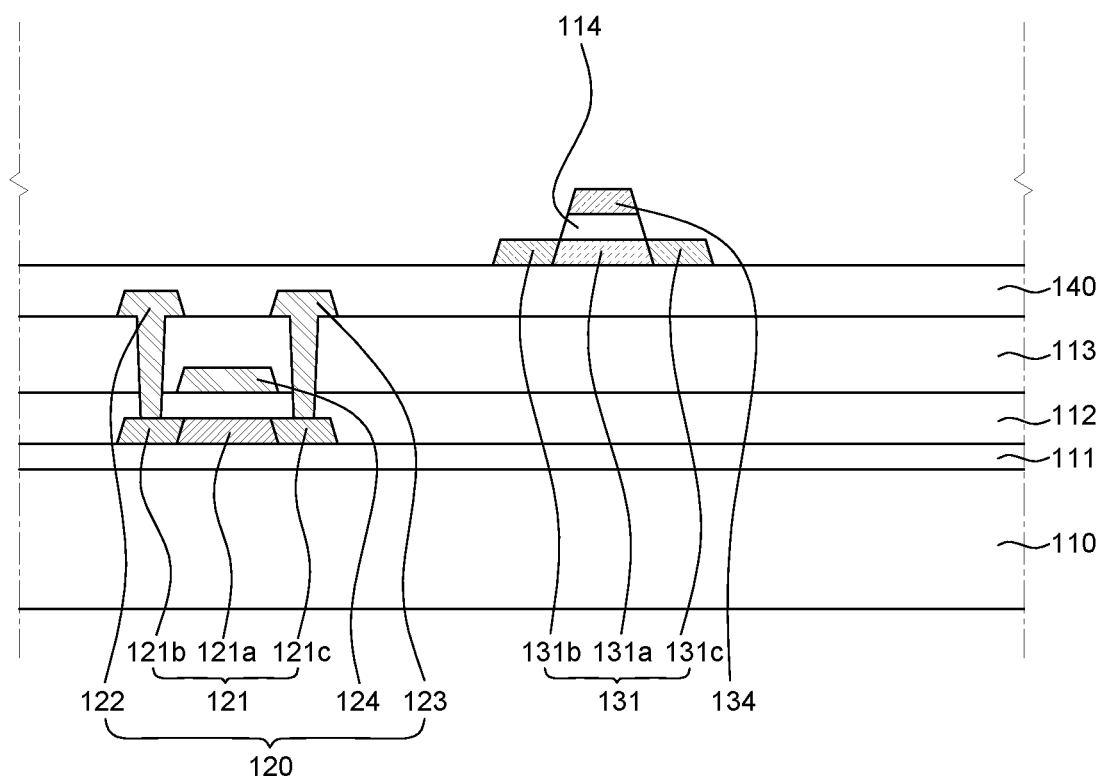

Referring to FIG. 7E, the second gate insulating layer 114 of the second thin film transistor 130 may be formed on the second active layer 131. Specifically, a single-layered second gate insulating layer 114 may be formed by depositing either silicon nitride (SiNx) or silicon oxide (SiOx), or a multilayered second gate insulating layer 114 may be formed by stacking alternately silicon nitride (SiNx) and silicon oxide (SiOx).

Subsequently, the second gate electrode 134 of the second thin film transistor 130 may be formed on the second gate insulating layer 114. The second gate electrode 134 of the second thin film transistor 130 is formed by depositing the material for the gate electrode on the second gate insulating layer 114 and patterning the material for the gate electrode. The material for the gate electrode may be various metal materials such as molybdenum (Mo) and the like. The second gate insulating layer 114 and the second gate electrode 134 may be simultaneously patterned. And the second gate insulating layer 114 and the second gate electrode 134 may be formed by overlapping with a second channel region 131a of the second active layer 131.

Figure 7F:
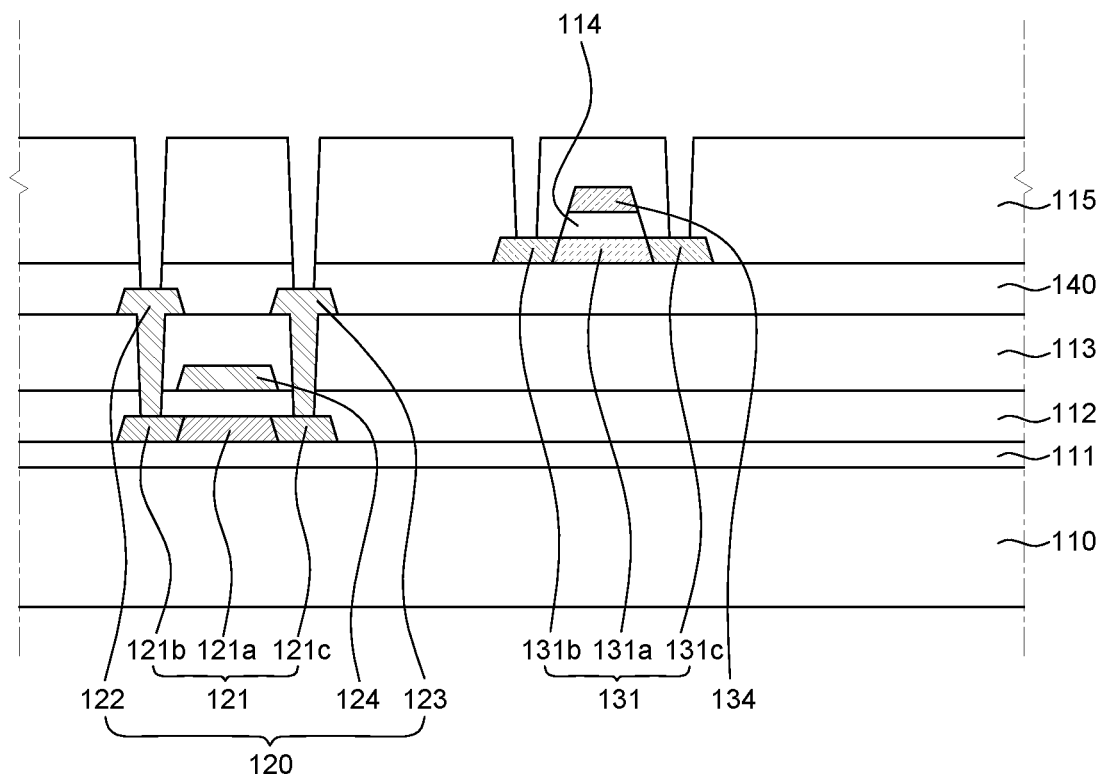

Next, referring to FIG. 7F, the second interlayer dielectric layer 115 may be formed on the isolation insulating layer 140, the second active layer 131, and the second gate electrode 134. A contact hole exposing the first source electrode 122 and the first drain electrode 123 and a contact hole exposing the second active layer 131 may be formed in the second interlayer dielectric layer 115. Specifically, the contact holes may be formed through the isolation insulating layer 140 and the second interlayer dielectric layer 115 to expose the first source electrode 122 and the first drain electrode 123. Also, a contact hole may be formed through the second interlayer dielectric layer 115 to expose the second active layer 131. At this time, the contact holes which expose the first source electrode 122 and the first drain electrode 123 through the isolation insulating layer 140 and the second interlayer dielectric layer 115 and the contact hole which exposes the second active layer 131 through the second interlayer dielectric layer 115 may be formed at the same time. That is, the contact holes which expose the first source electrode 122 and the first drain electrode 123 through the isolation insulating layer 140 and the second interlayer dielectric layer 115 and the contact hole which exposes the second active layer 131 through the second interlayer dielectric layer 115 may be formed by same process. Since the second thin film transistor 130 is formed after the first source electrode 122 and the first drain electrode 123 of the first thin film transistor 120 are formed, even if the two contact holes are simultaneously formed, the damage to the second active layer 131 may be reduced. The process of forming the contact holes passing through a plurality of layers is performed using dry etching as described above. Accordingly, when the contact hole is formed to expose the second active layer 131, the surface damage of the second active layer 131 may be present. However, before forming the isolation insulating layer 140, the first source electrode 122 and the first drain electrode 123 of the first thin film transistor 120 is formed, and the contact holes exposing the first source electrode 122 and the first drain electrode 123 are formed by penetrating only the second interlayer dielectric layer 115 and the isolation insulating layer 140, thereby reducing the damage.

Next, a connection source electrode 150, a connection drain electrode 151, and a second source electrode 132 and a second drain electrode 133 of the second thin film transistor 130 are formed (S130).

Figure 7G:
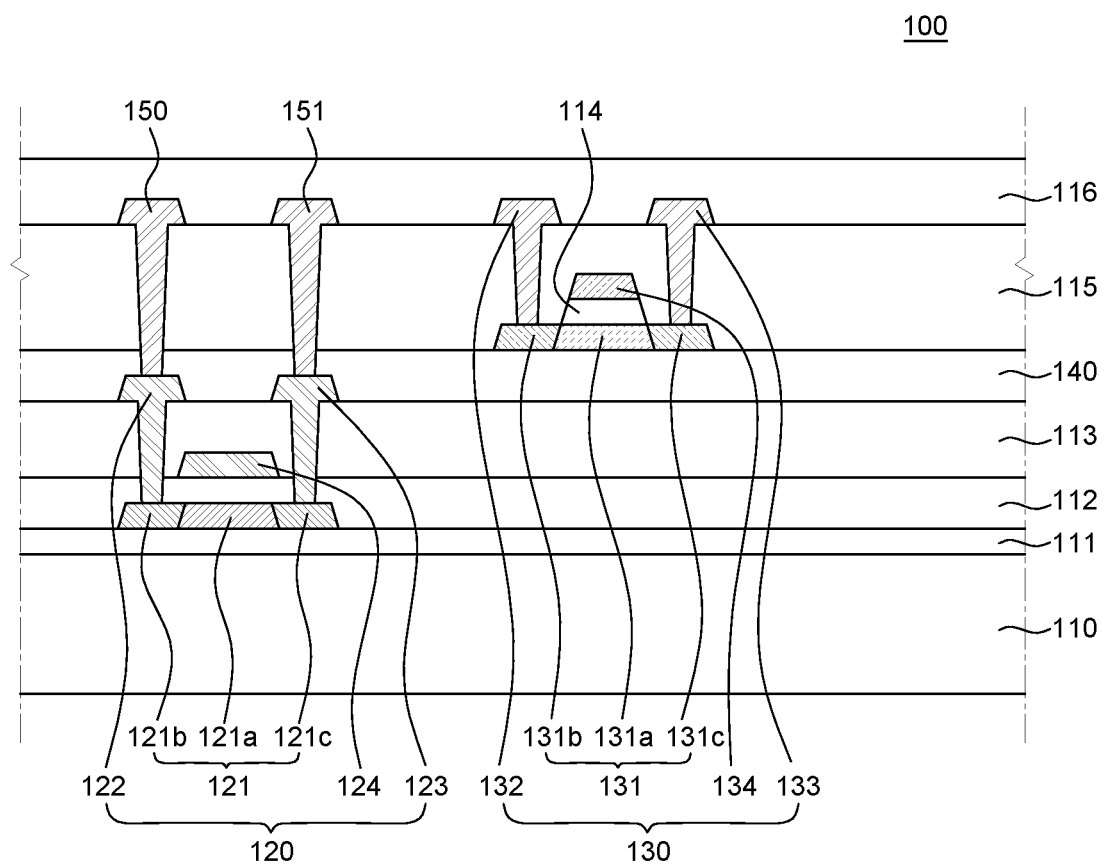

Referring to FIG. 7G, the connection source electrode 150 and the connection drain electrode 151 may be formed to be connected to the first source electrode 122 and the first drain electrode 151 through the isolation insulating layer 140 and the second interlayer dielectric layer 115, respectively. At this time, the connection source electrode 150 and the connection drain electrode 151 may be connected to the first source electrode 122 and the first drain electrode 123 through the contact holes exposing the first source electrode 122 and the first drain electrode 123 through the isolation insulating layer 140 and the second interlayer dielectric layer 115. Meanwhile, the second source electrode 132 and the second drain electrode 133 of the second thin film transistor 130 may be formed to be connected to the second active layer 131 through the second interlayer dielectric layer 115. At this time, the second source electrode 132 and the second drain electrode 133 may be connected to the second active layer 131 through the contact hole exposing the second active layer 131. The second source electrode 132 is connected to the second source region 131b of the second active layer 131, and the second drain electrode 133 may be connected to the second drain region 131c of the second active layer 131.

The connection source electrode 150, the connection drain electrode 151, the second source electrode 132, and the second drain electrode 132 may be formed by depositing and patterning the materials for the source and the drain electrode on the second interlayer dielectric layer 115. At this time, each of the electrodes may have a three-layer structure of titanium (Ti)/aluminum (Al)/titanium (Ti), and the patterning process may be performed through dry etching. Further, the connection source electrode 150, the connection drain electrode 151, the second source electrode 132, and the second drain electrode 133 may be formed at the same time. That is, the connection source electrode 150, the connection drain electrode 151, the second source electrode 132, and the second drain electrode 133 may be formed by the same process. The connection source electrode 150, the connection drain electrode 151, the second source electrode 132 and the second drain electrode 133 may be made of the same materials for the source and drain electrodes.

Subsequently, a passivation layer 116 may be formed to cover the second thin film transistor 130 (S140).

Referring to FIG. 7G, the passivation layer 116 may be formed on the connection source electrode 150, the connection drain electrode 151, the second source electrode 132, the second drain electrode 133, and the second interlayer dielectric layer 115. The passivation layer 116 may be formed of an insulating layer for protecting the first thin film transistor 120 and the second thin film transistor 130. A planarization layer may be further formed on the passivation layer 116. The planarization layer may planarize the upper surfaces of the first thin film transistor 120 and the second thin film transistor 130 to more reliably form the display device. An organic light emitting element and an encapsulating portion or a liquid crystal display unit may be further formed on the planarization layer.

Figure 8:
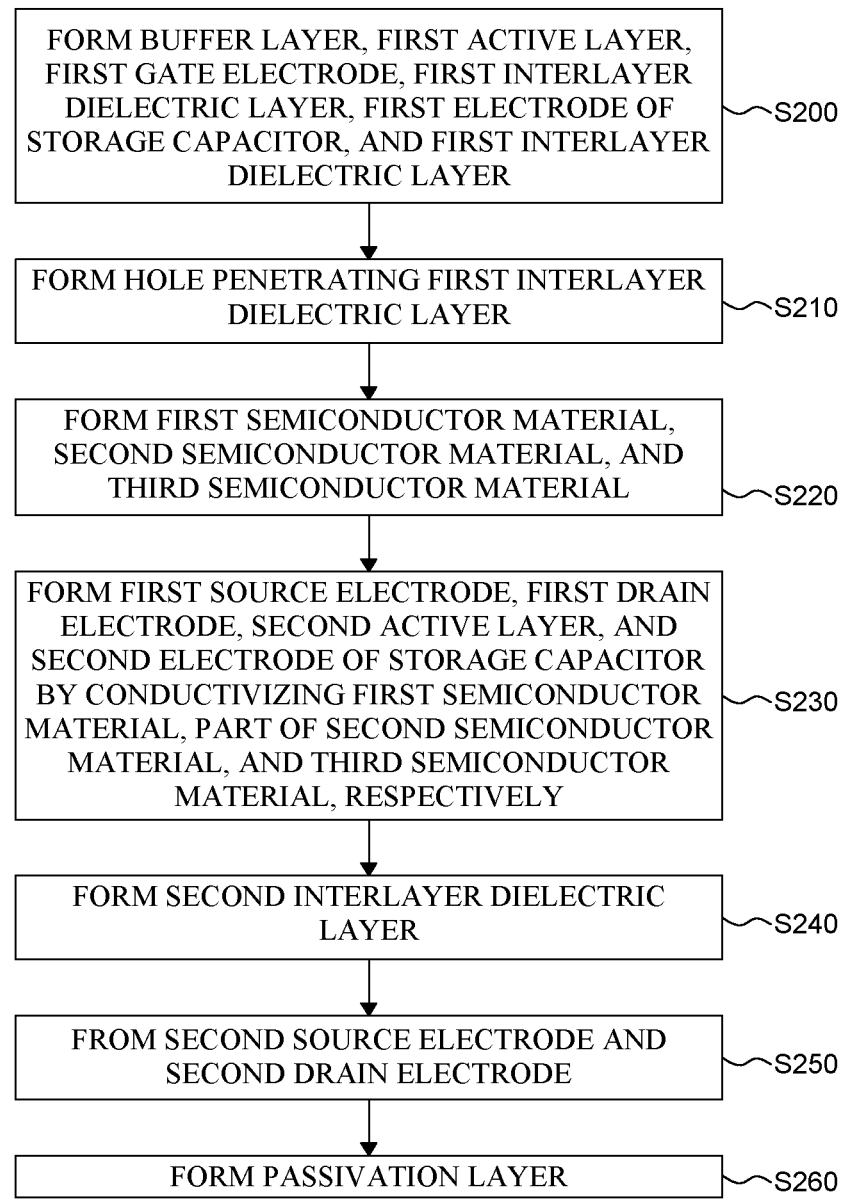
FIG. 8 is a schematic flowchart for describing a method for manufacturing a display device according to another exemplary embodiment of the present disclosure.

FIG. 8 is a schematic flowchart for describing a method for manufacturing a display device 300 according to another exemplary embodiment of the present disclosure. FIGS. 9A to 9E are process cross-sectional views illustrating the manufacturing method of the display device 300 according to another exemplary embodiment of the present disclosure. FIGS. 8, and 9A to 9E are a flowchart and process cross-sectional views for describing the method for manufacturing the display device 300 illustrated in FIG. 4 and the duplicated description will be omitted.

First, a buffer layer 311, a first active layer 321, a first gate electrode 324, a first electrode 351 of a storage capacitor 350, and a first interlayer dielectric layer 313 are formed on a substrate 310 (S200).

Figure 9A:
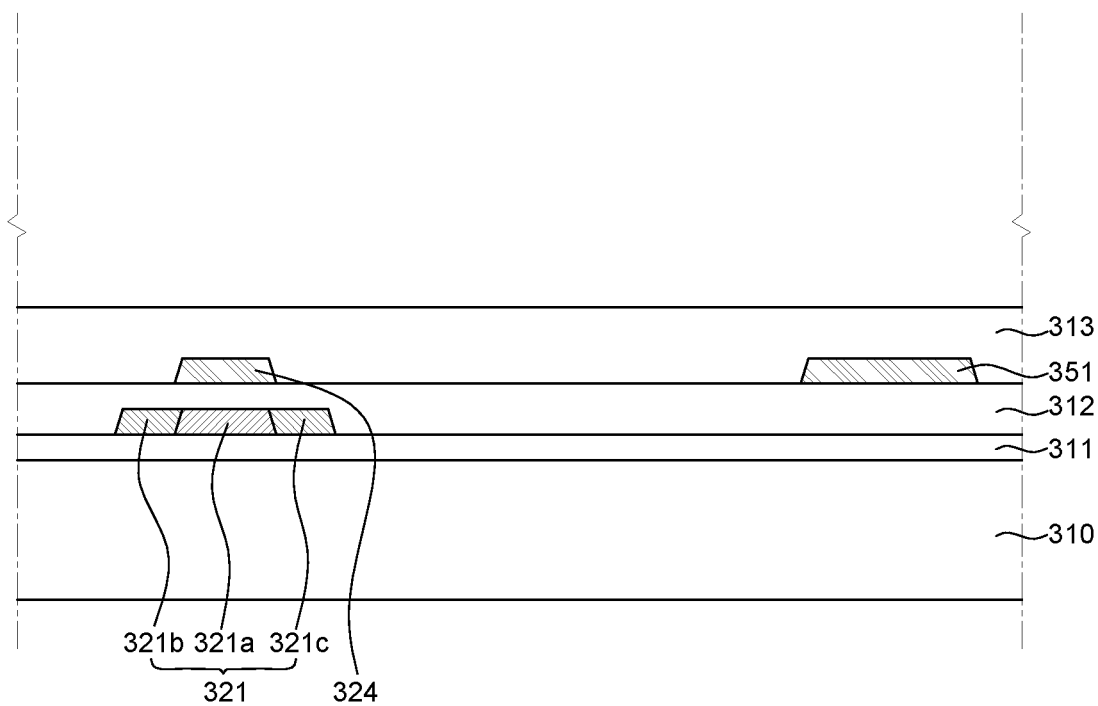
FIGS. 9A to 9E are process cross-sectional views for describing a method for manufacturing a display device according to another exemplary embodiment of the present disclosure.

Referring to FIG. 9A, the barrier layer 311 is disposed on the substrate 310. Specifically, a single-layered buffer layer 311 may be formed by depositing either silicon nitride (SiNx) or silicon oxide (SiOx), or a multilayered buffer layer 311 may be formed by stacking alternately silicon nitride (SiNx) and silicon oxide (SiOx).

Subsequently, a first active layer 321 of the first thin film transistor 320 is formed on the buffer layer 311. Subsequently, a first gate insulating layer 312 of the first thin film transistor 320 is formed on the first active layer 321 of the first thin film transistor 320. Subsequently, a first gate electrode 324 of the first thin film transistor 320 and a first electrode 351 of the storage capacitor 350 are formed on the first gate insulating layer 312. The first gate electrode 324 of the first thin film transistor 320 and the first electrode 351 of the storage capacitor 350 are formed by depositing a material for the gate electrode on the first gate insulating layer 312 and patterning the material for the gate electrode.

Subsequently, a doping process for the first active layer 321 of the first thin film transistor 320 is performed using the first gate electrode 324 of the first thin film transistor 320 as a mask. Subsequently, a first interlayer dielectric layer 313 of the first thin film transistor 320 is formed on the first gate electrode 324 of the first thin film transistor 320 and the first electrode 351 of the storage capacitor 350.

Figure 9B:
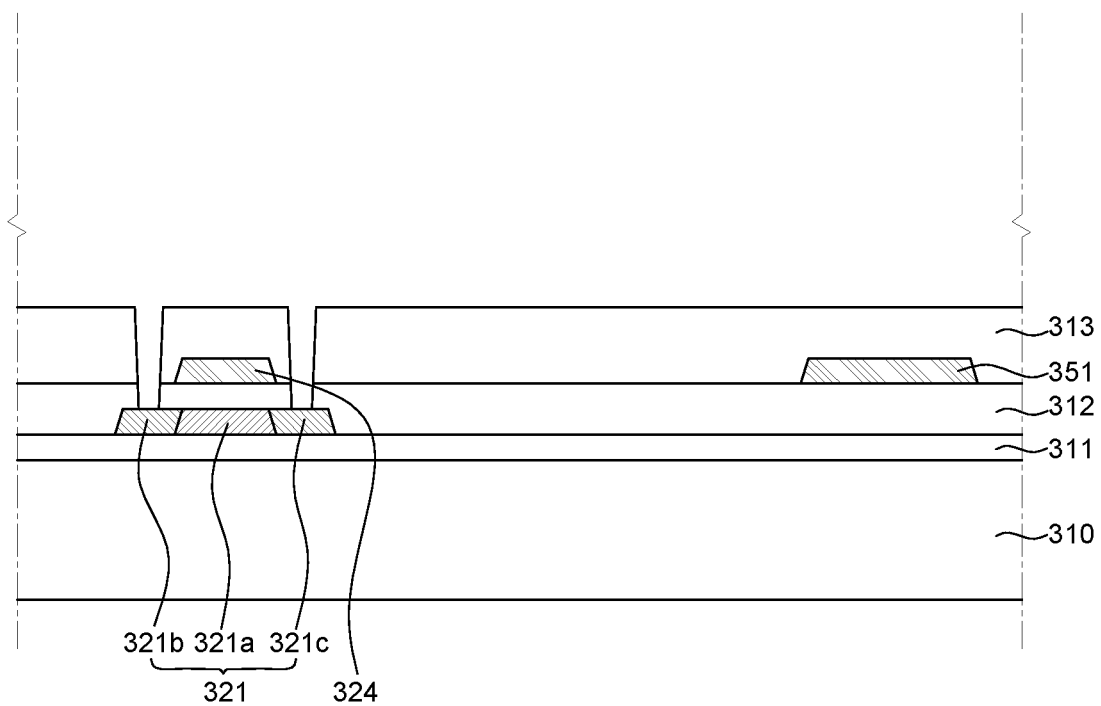

Subsequently, a hole penetrating the first interlayer dielectric layer 313 is formed (S210). Referring to FIG. 9B, a first contact hole, that exposes the first active layer 321 of the first thin film transistor 320 through the first gate insulating layer 312 and the first interlayer dielectric layer 313 of the first thin film transistor 320, is formed.

A first semiconductor material 410 which is connected to the first active layer 321 through the hole penetrating the first gate insulating layer 312 and the first interlayer dielectric layer 313, a second semiconductor material 420, and a third semiconductor material 430 are formed (S220).

Figure 9C:
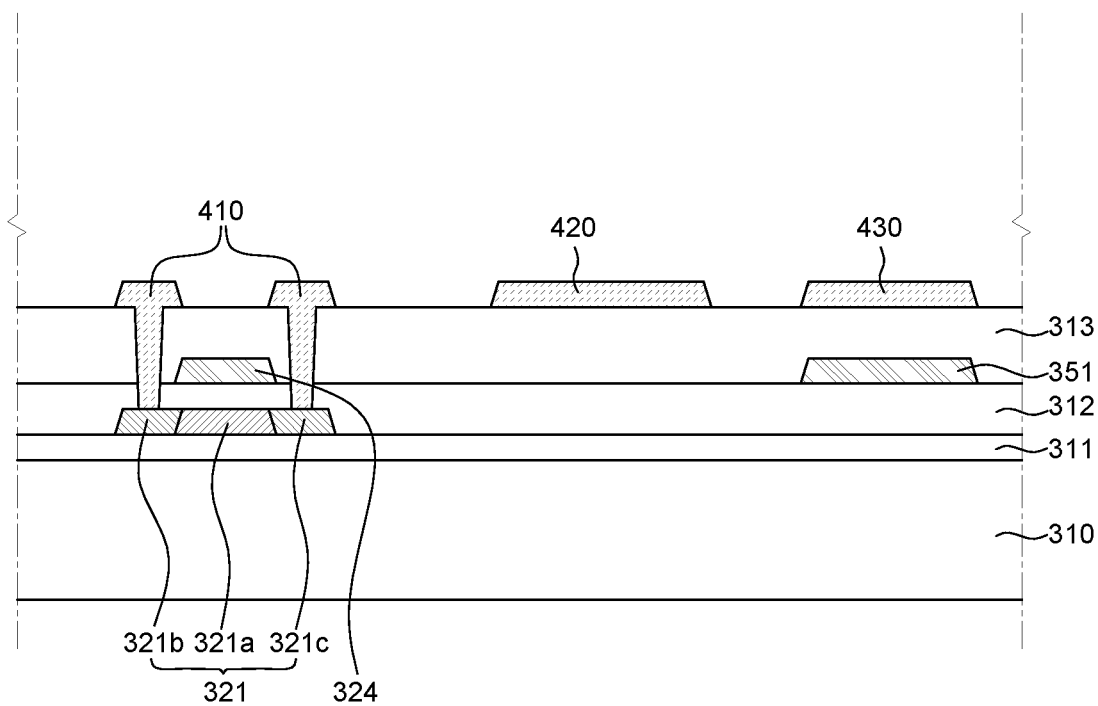

Referring to FIG. 9C, the first semiconductor material 410 is formed to be connected to the first active layer 321 through the first contact hole exposing the first active layer 321. The first semiconductor material 410, the second semiconductor material 420, and the third semiconductor material 430 are formed on the first interlayer dielectric layer 313. At this time, the first semiconductor material 410, the second semiconductor material 420, and the third semiconductor material 430 may be formed of the same semiconductor material. For example, a IGZO layer may be formed by depositing indium-gallium-zinc-oxide (IGZO). The second active layer 331 of the second thin film transistor 330 is formed based on the IGZO layer on the assumption that the second active layer 331 is made of IGZO among various metal oxides, but is not limited thereto, and the second active layer 331 may be formed of a metal oxide other than IGZO. The metal oxide may be formed to cover the entire first interlayer dielectric layer 313. Next, after the heat treatment process for stabilizing the metal oxide is performed, the metal oxide is patterned by dry etching to form the first semiconductor material 410, the second semiconductor material 420, and the third semiconductor material 430.

Figure 9D:
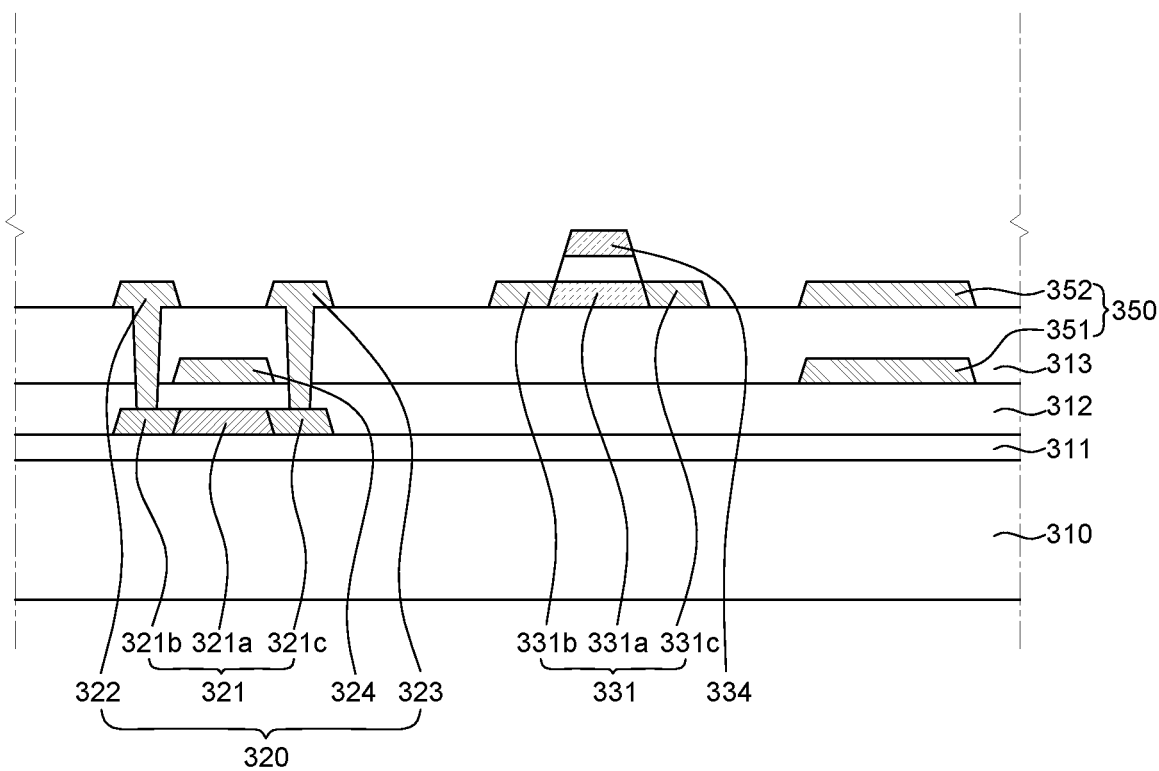

Subsequently, referring to FIG. 9D, the first semiconductor material 410, a part of the second semiconductor material 420 and the third semiconductor material 430 are electrically conductivized to form the first source electrode 322, the first drain electrode 323, the second active layer 331, and the second electrode 352 of the storage capacitor 350 (S230).

Next, the second gate electrode 334 of the second thin film transistor 330 may be formed on the second semiconductor material 420. The second gate electrode 334 may be formed on the second gate insulating layer 314. The second gate insulating layer 314 and the second gate electrode 334 may be simultaneously patterned. The second gate insulating layer 314 and the second gate electrode 334 may be formed by overlapping with a second channel region 331a of the second active layer 331. At this time, the second gate insulating layer 314 and the second gate electrode 334 may be patterned by the same mask.

The first semiconductor material 410, a portion of the second semiconductor material 420 that does not overlap with the second gate electrode 334, and the third semiconductor material 430 may be conductivized by ion-doping or heat-treating. In this case, the first semiconductor material 410, the portion of the second semiconductor material 420 that does not overlap with the second gate electrode 334, and the third semiconductor material 430 may be electrically conductivized through a conducting process at the same time. The first semiconductor material 410 may be electrically conductivized to form the first source electrode 322 and the first drain electrode 323 of the first thin film transistor 320. The portion of the second semiconductor material 420 which does not overlap with the second gate electrode 334 is electrically conductivized to form the second source region 331b of the second drain region 331c of the second active layer 331 of the second thin film transistor 330. In addition, the third semiconductor material 430 may be electrically conductivized to form the second electrode 352 of the storage capacitor 350.

Figure 9E:
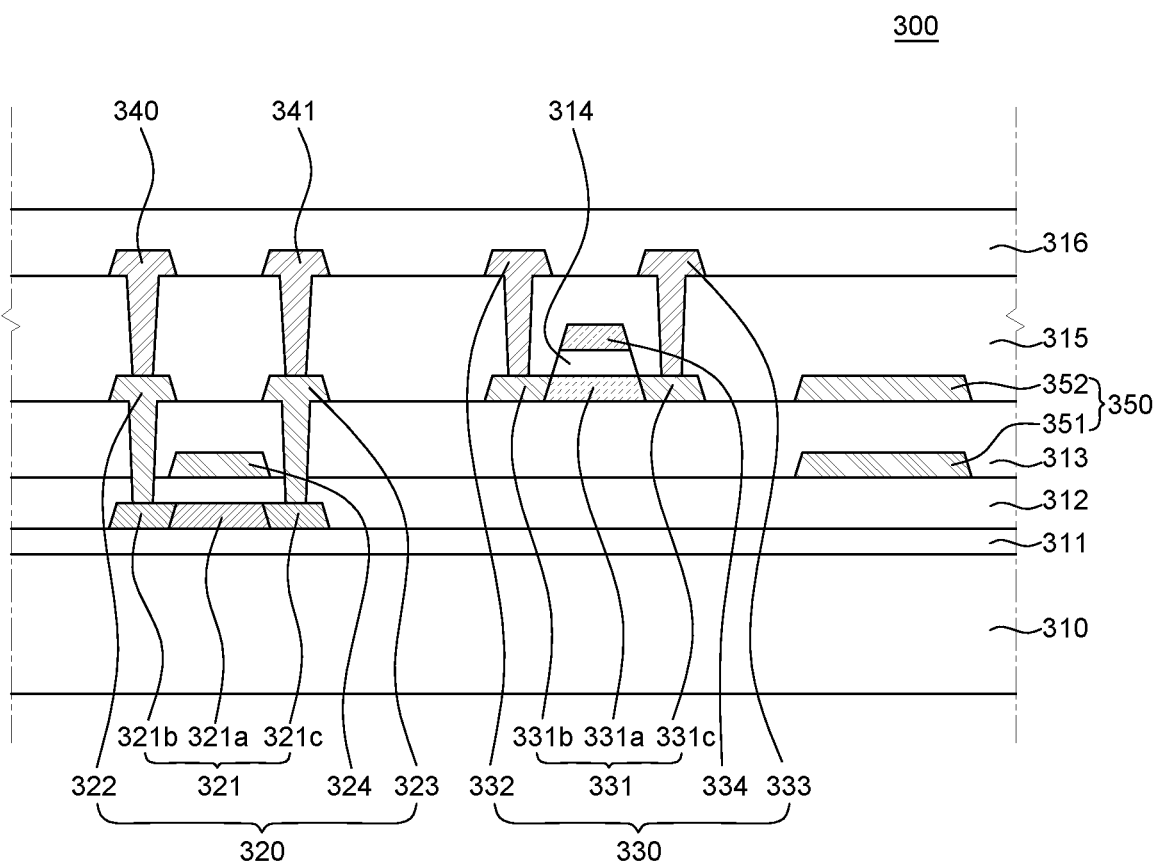

Subsequently, the second interlayer dielectric layer 315 is formed (S240). Referring to FIG. 9E, the second interlayer dielectric layer 315 may be formed on the first source electrode 322, the first drain electrode 323, the second active layer 331, the second gate electrode 334, the second electrode 352 of the storage capacitor 350.

Subsequently, the second source electrode 332 and the second drain electrode 333 are formed (S250). The second source electrode 332 and the second drain electrode 333 may be electrically connected to the second active layer 331 of the second thin film transistor 330 through the second interlayer dielectric layer 315. A second contact hole, that exposes the second active layer 331 through the second interlayer dielectric layer 315, may be formed in the second interlayer dielectric layer 315. The second source electrode 332 and the second drain electrode 333 may be connected to the second active layer 331 through the second contact hole exposing the second active layer 331. The second source electrode 332 and the second drain electrode 333 may be formed by forming source and drain materials on the second interlayer dielectric layer 315 and patterning the source and drain materials through dry etching.

Further, a connection source electrode 340 and a connection drain electrode 341, which are electrically connected to the first source electrode 322 and the first drain electrode 323 through a third contact hole, may be further formed. The third contact hole that exposes the first source electrode 322 and the first drain electrode 323 through the second interlayer dielectric layer 315 may be formed in the second interlayer dielectric layer 315. The connection source electrode 340 and the connection drain electrode 341 may be connected to the first source electrode 322 and the first drain electrode 322 through the third contact hole exposing the first source electrode 323 and the first drain electrode 323, respectively.

The connection source electrode 340, the connection drain electrode 341, the second source electrode 332, and the second drain electrode 333 may be formed at the same time. That is, The connection source electrode 340, the connection drain electrode 341, the second source electrode 332, and the second drain electrode 333 may be formed by the same process. Particularly, the third contact hole exposing the first source electrode 322 and the first drain electrode 323 through the second interlayer dielectric layer 315 and the second contact hole exposing the second active layer 331 through the second interlayer dielectric layer 315 may be formed through the same dry etching process. Subsequently, the connection source electrode 340, the connection drain electrode 341, the second source electrode 332, and the second drain electrode 333 may be formed at the same time. The connection source electrode 340, the connection drain electrode 341, the second source electrode 332, and the second drain electrode 333 may be simultaneously formed by depositing and patterning the source and drain material on the second interlayer dielectric layer 315. The connection source electrode 340, the connection drain electrode 341, the second source electrode 332, and the second drain electrode 333 may be made of the same materials for the source and drain electrodes and have the same thickness toward the upper layer from the second interlayer dielectric layer 315.

Subsequently, a passivation layer 316 is formed (S260). The passivation layer 316 may be formed on the connection source electrode 340, the connection drain electrode 341, the second source electrode 332, the second drain electrode 333, and the second interlayer dielectric layer 315. The passivation layer 316 may be formed of an insulating layer for protecting the first thin film transistor 320 and the second thin film transistor 330. A planarization layer may be further formed on the passivation layer 316. The planarization layer may planarize the upper surfaces of the first thin film transistor 320 and the second thin film transistor 330 to more reliably form the display device. An organic light emitting element and an encapsulating portion or a liquid crystal display unit may be further formed on the planarization layer.

The exemplary embodiments of the present disclosure can also be described as follows:

According to an aspect of the present disclosure, a display device may include: a first thin film transistor including a first active layer, a first gate electrode overlapped with the first active layer, a first interlayer dielectric layer on the first gate electrode, and a first source electrode and a first drain electrode connected to the first active layer by penetrating the first interlayer dielectric layer; an isolation insulating layer on the first thin film transistor; a second thin film transistor including a second active layer on the isolation insulating layer, a second gate electrode overlapped with the second active layer, a second interlayer dielectric layer on the second gate electrode, and a second source electrode and a second drain electrode connected to the second active layer by penetrating the second interlayer dielectric layer; and a connection source electrode and a connection drain electrode connected to the first source electrode and the first drain electrode, respectively by penetrating the isolation insulating layer and the second interlayer dielectric layer.

According to another aspect of the present disclosure, the first active layer may be made of low temperature polycrystalline silicon (LTPS), and the second active layer may be made of an oxide semiconductor.

According to yet another aspect of the present disclosure, at least one of the first source electrode and the first drain electrode may be in contact with a lateral surface of the first active layer while penetrating the first active layer.

According to still yet another aspect of the present disclosure, at least one of the first source electrode and the first drain electrode may be in contact with an upper surface of the first active layer extended along the lateral surface of the first active layer.

According to still yet another aspect of the present disclosure, the display device may further include: a second touch electrode on the same layer as the first active layer, and spaced apart from the first active layer; a first touch electrode under the second touch electrode; and a third touch electrode on the same layer as the first gate electrode, and spaced apart from the first gate electrode, wherein the first touch electrode, the second touch electrode, and the third touch electrode may overlap with each other.

According to still yet another aspect of the present disclosure, portions of the first active layer connected to each of the first source electrode and the first drain electrode, may be conductivized.

According to an another aspect of the present disclosure, A display device may include: a first thin film transistor including a first active layer, a first gate electrode overlapped with the first active layer, a first interlayer dielectric layer on the first gate electrode, and a first source electrode and a first drain electrode connected to the first active layer through a first contact hole of the first interlayer dielectric layer; and a second thin film transistor on the first interlayer dielectric layer including a second active layer on the first interlayer dielectric layer, a second gate electrode overlapped with the second active layer, a second interlayer dielectric layer on the second active layer and the second gate electrode, and a second source electrode and a second drain electrode connected to the second active layer through a second contact hole of the second interlayer dielectric layer, the first active layer and the second active layer may be made of different materials, and the first source electrode and the first drain electrode may be made of a conductivized semiconductor material.

According to yet another aspect of the present disclosure, the first active layer may be made of low temperature polycrystalline silicon (LIPS), and the second active layer may be made of an oxide semiconductor.

According to still yet another aspect of the present disclosure, the first source electrode and the first drain electrode may be made of the same material as portions of the second active layer connected to the second source electrode and the second drain electrode, respectively.

According to still yet another aspect of the present disclosure, the first source electrode and the first drain electrode may have an offset resistance value of 1 to 2Ω.

According to still yet another aspect of the present disclosure, the first source electrode and the first drain electrode may be made of different materials from the second source electrode and the second drain electrode.

According to still yet another aspect of the present disclosure, the display device may further include a connection source electrode and a connection drain electrode connected to the first source electrode and the first drain electrode, respectively through a third contact hole of the second interlayer dielectric layer.

According to still yet another aspect of the present disclosure, a height from an upper end of the first active layer up to the upper end of the first interlayer dielectric layer may be larger than a height from the upper end of the first active layer up to the upper ends of the first source electrode and the first drain electrode, and the connection source electrode and the connection drain electrode may be connected to the first source electrode and the first drain electrode, respectively through the third contact hole of the second interlayer dielectric layer and the first contact hole of the first interlayer dielectric layer.

According to still yet another aspect of the present disclosure, the display device may further include a storage capacitor including a first electrode and a second electrode, and one of the first and second electrodes may be formed on the first interlayer dielectric layer and made of the same material as the first source electrode and the first drain electrode.

According to an yet another aspect of the present disclosure, a method for manufacturing a display device may include: forming a first active layer, a first gate electrode overlapped with the first active layer, a first interlayer dielectric layer on the first gate electrode, and a first source electrode and a first drain electrode connected to the first active layer by penetrating the first interlayer dielectric layer; forming an isolation insulating layer so as to cover the first source electrode and the first drain electrode; forming a second active layer on the isolation insulating layer, a second gate electrode overlapped with the second active layer, and a second interlayer dielectric layer on the second active layer and the second gate electrode; forming a hole penetrating at least one of the isolation insulating layer and the second interlayer dielectric layer; and forming a connection source electrode and a connection drain electrode connected to the first source electrode and the first drain electrode, respectively through a hole penetrating both of the isolation insulating layer and the second interlayer dielectric layer and forming a second source electrode and a second drain electrode connected to the second active layer through a hole penetrating only the second interlayer dielectric layer.

According to yet another aspect of the present disclosure, at least one of the first source electrode and the first drain electrode may be in contact with a lateral surface of the first active layer while penetrating the first active layer.

According to still yet another aspect of the present disclosure, at least one of the first source electrode and the first drain electrode may be in contact with an upper surface of the first active layer extended along the lateral surface of the first active layer.

According to yet another aspect of the present disclosure, a method for manufacturing a display device may include: forming a first active layer, a first gate electrode overlapped with the first active layer, a first interlayer dielectric layer on the first gate electrode; forming a hole penetrating the first interlayer dielectric layer; forming a first semiconductor material connected to the first active layer through the hole and a second semiconductor material on the first interlayer dielectric layer to be spaced apart from the first semiconductor material; forming a second gate electrode on a part of the second semiconductor material; forming a first source electrode and a first drain electrode with the first semiconductor material and forming a second active layer having conductivized source and drain regions at both sides of the second semiconductor material by conductivizing both sides of the second semiconductor material and the first semiconductor material; forming a second interlayer dielectric layer covering the first source electrode, the first drain electrode, and the second gate electrode; and forming a second source electrode and a second drain electrode connected to the second active layer by penetrating the second interlayer dielectric layer and the first active layer and the second active layer may be made of different materials.

According to yet another aspect of the present disclosure, the forming of the second source electrode and the second drain electrode may further include forming a connection source electrode and a connection drain electrode connected to the first source electrode and the first drain electrode, respectively by penetrating the second interlayer dielectric layer.

According to still yet another aspect of the present disclosure, a height from an upper end of the first active layer up to the upper end of the first interlayer dielectric layer may be larger than a height from the upper end of the first active layer up to the upper ends of the first source electrode and the first drain electrode, and the connection source electrode and the connection drain electrode may be connected to the first source electrode and the first drain electrode, respectively by further penetrating the first interlayer dielectric layer.

According to still yet another aspect of the present disclosure, the forming of the first semiconductor material and the second semiconductor material may further include forming a third semiconductor material spaced apart from the first and second semiconductor materials on the first interlayer dielectric layer, the conductivizing both sides of second semiconductor material and the first semiconductor material may further include conductivizing the third semiconductor material to form a second electrode, the second electrode may be made of the same material as the first source electrode and the first drain electrode, and the second electrode may be one of electrodes of a storage capacitor.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:
1. A display device comprising:
a display element;
a first thin film transistor including a first active layer, a first gate electrode on the first active layer and a first source electrode and a first drain electrode connected to the first active layer, the first thin film transistor configured to drive the display element;
a second thin film transistor including a second active layer, a second gate electrode on the second active layer and a second source electrode and a second drain electrode connected to the second active layer;

a first storage electrode formed on a same layer as the first gate electrode and made of a same material as the first gate electrode, wherein the first storage electrode is closer to the second gate electrode than the first gate electrode; and a second storage electrode disposed on the first storage electrode and overlapped with the first storage electrode, and an interlayer dielectric layer disposed on the first gate electrode and the second storage electrode, wherein the first source electrode, the first drain electrode, the second source electrode, and the second drain electrode are disposed on the interlayer dielectric layer, wherein the first source electrode, the first drain electrode, the second source electrode and the second drain electrode are made of a same material and at least in part arranged in a same layer, wherein a first set of insulating layers are arranged between the first active layer and the second active layer, wherein the first set of insulating layers are above the first active layer and below the second active layer, wherein a second set of insulating layers are arranged between the first gate electrode and the second gate electrode, the first set of insulating layers at least in part being different from the second set of insulating layers, and wherein the second storage electrode is disposed between at least one of the first set of insulating layers and the interlayer dielectric layer.

2. The display device of claim 1, wherein the first source electrode, the first drain electrode, the second source electrode and the second drain electrode have a three-layer structure of titanium (Ti), aluminum (Al), and titanium (Ti).

3. The display device of claim 1, further comprising:
a planarization layer on the first thin film transistor and the second thin film transistor; and
an anode, an organic layer, a cathode and an encapsulating portion on the planarization layer.

4. The display device of claim 1, wherein each of the first storage electrode and the second storage electrode is a touch electrode.

5. The display device of claim 4, wherein the touch electrode is formed on a layer where the first thin film transistor or the second thin film transistor are formed.

6. The display device of claim 5, further comprising:
an additional insulating layer disposed between the touch electrode and the second thin film transistor.

7. The display device of claim 1, further comprising:
a touch pad disposed inside the display device.

8. The display device of claim 1, further comprising:
a buffer layer disposed below the first active layer to form BSM (Base Shield Metal).

9. The display device of claim 8, wherein the buffer layer is made of mono-layer of silicon nitride (SiNx) or silicon oxide (SiOx), or multi-layer of silicon nitride (SiNx) and silicon oxide (SiOx).

10. The display device of claim 1, wherein the first active layer is made of LTPS (Low Temperature Poly-Silicon), and the second active layer is made of an oxide semiconductor.

11. The display device of claim 1, wherein the first source electrode, the first drain electrode and a part of the second active layer comprise a conductivized semiconductor material.

12. The display device of claim 1, wherein the connection source electrode and the connection drain electrode of the first thin film transistor is disposed on an insulating layer, the insulating layer disposed below the second active layer.

* * * * *